(12) United States Patent
Kira et al.

(10) Patent No.: US 9,713,283 B2
(45) Date of Patent: Jul. 18, 2017

(54) ELECTRONIC APPARATUS AND FILTER UNIT

(71) Applicant: FUJITSU LIMITED, Kawasaki-shi, Kanagawa (JP)

(72) Inventors: Yusuke Kira, Kawasaki (JP); Katsuki Matsunaga, Yokohama (JP); Kazuhiro Iino, Yokohama (JP); Kouichi Kuramitsu, Setagaya (JP); Takashi Shirakami, Kawasaki (JP); Seiichiro Sato, Inagi (JP); Marco Scifoni, Kawasaki (JP)

(73) Assignee: FUJITSU LIMITED, Kawasaki (JP)

( * ) Notice: Subject to any disclaimer, the term of this patent is extended or adjusted under 35 U.S.C. 154(b) by 50 days.

(21) Appl. No.: 14/722,183

(22) Filed: May 27, 2015

(65) Prior Publication Data

US 2015/0373875 A1 Dec. 24, 2015

(30) Foreign Application Priority Data

Jun. 18, 2014 (JP) ................. 2014-125475

(51) Int. Cl.
| | |
|---|---|
| *B01D 47/00* | (2006.01) |
| *B01D 51/00* | (2006.01) |
| *B01D 45/00* | (2006.01) |
| *B01D 57/00* | (2006.01) |
| *F25B 13/00* | (2006.01) |
| *F25D 17/04* | (2006.01) |
| *F25D 17/06* | (2006.01) |
| *H05K 7/20* | (2006.01) |

(52) U.S. Cl.
CPC ..... *H05K 7/20181* (2013.01); *H05K 7/20581* (2013.01); *B01D 2273/14* (2013.01); *B01D 2279/45* (2013.01)

(58) Field of Classification Search
CPC ........ B01D 47/00; B01D 51/00; B01D 45/00; B01D 57/00; F25B 13/00; F25D 17/04; F25D 17/06
USPC ........ 55/471, 472, 473, 385.2, 385.6; 96/15, 96/96; 62/317, 427; 165/96, 119; 454/155, 158, 184, 192
See application file for complete search history.

(56) References Cited

U.S. PATENT DOCUMENTS

| | | | |
|---|---|---|---|
| 6,344,065 B1 * | 2/2002 | Boulva ................ | B01D 46/543 55/385.2 |
| 7,350,371 B2 * | 4/2008 | Lee ....................... | F24F 1/0007 62/317 |

(Continued)

FOREIGN PATENT DOCUMENTS

| | | |
|---|---|---|
| JP | 4-123591 | 11/1992 |
| JP | 7-236805 | 9/1995 |

(Continued)

*Primary Examiner* — Jacob T Minskey
*Assistant Examiner* — Minh-Chau Pham
(74) *Attorney, Agent, or Firm* — Staas & Halsey LLP

(57) ABSTRACT

An electronic apparatus includes a housing that includes an air inlet, and an air-intake duct section provided to supply air to the air inlet, and a filter housing that houses a filter provided to cover the air inlet, and moves toward the air-intake duct section in a thickness direction of the filter housing, to shift from a closed state in which the filter covers the air inlet to an open state in which the air inlet is uncovered.

19 Claims, 28 Drawing Sheets

(56) References Cited

U.S. PATENT DOCUMENTS

| | | | | |
|---|---|---|---|---|
| 8,057,565 B2* | 11/2011 | Yabu | ............ | F24F 1/0007 55/378 |
| 9,255,722 B2* | 2/2016 | Kim | ............ | F24F 1/0014 |
| 2005/0108996 A1* | 5/2005 | Latham | ............ | B01D 46/0023 55/385.2 |
| 2005/0284168 A1* | 12/2005 | Lee | ............ | F24F 1/0007 62/317 |
| 2009/0311951 A1* | 12/2009 | Walkinshaw | ............ | B60H 3/0007 451/261 |
| 2013/0070409 A1* | 3/2013 | Hoss | ............ | G06F 1/20 361/679.31 |
| 2013/0074460 A1* | 3/2013 | Sakuragi | ............ | B01D 46/42 55/471 |
| 2015/0300677 A1* | 10/2015 | Wang | ............ | E06B 7/02 96/384 |

FOREIGN PATENT DOCUMENTS

| | | |
|---|---|---|
| JP | 2003-8272 | 1/2003 |
| JP | 2007-115020 | 5/2007 |

* cited by examiner

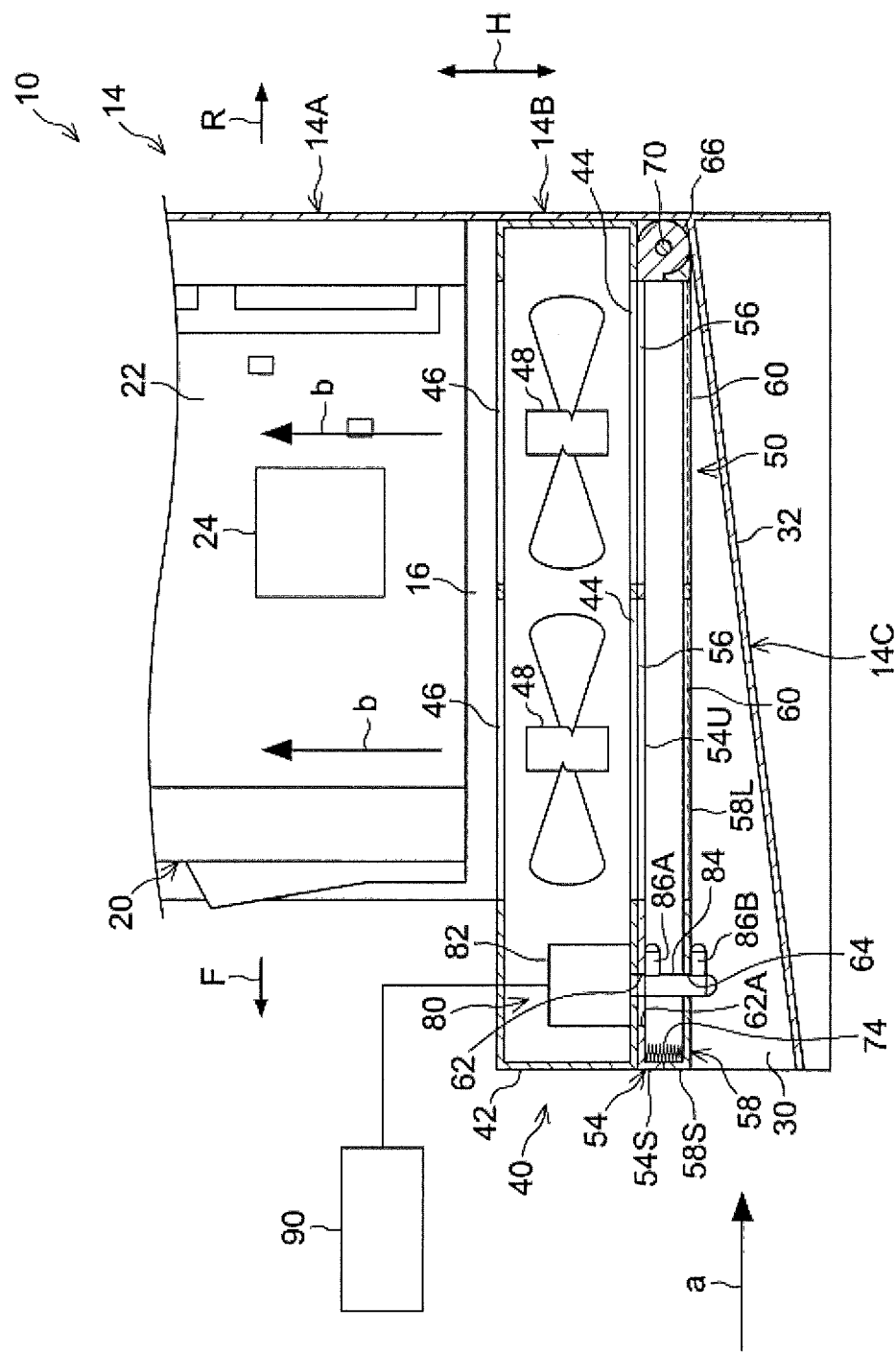

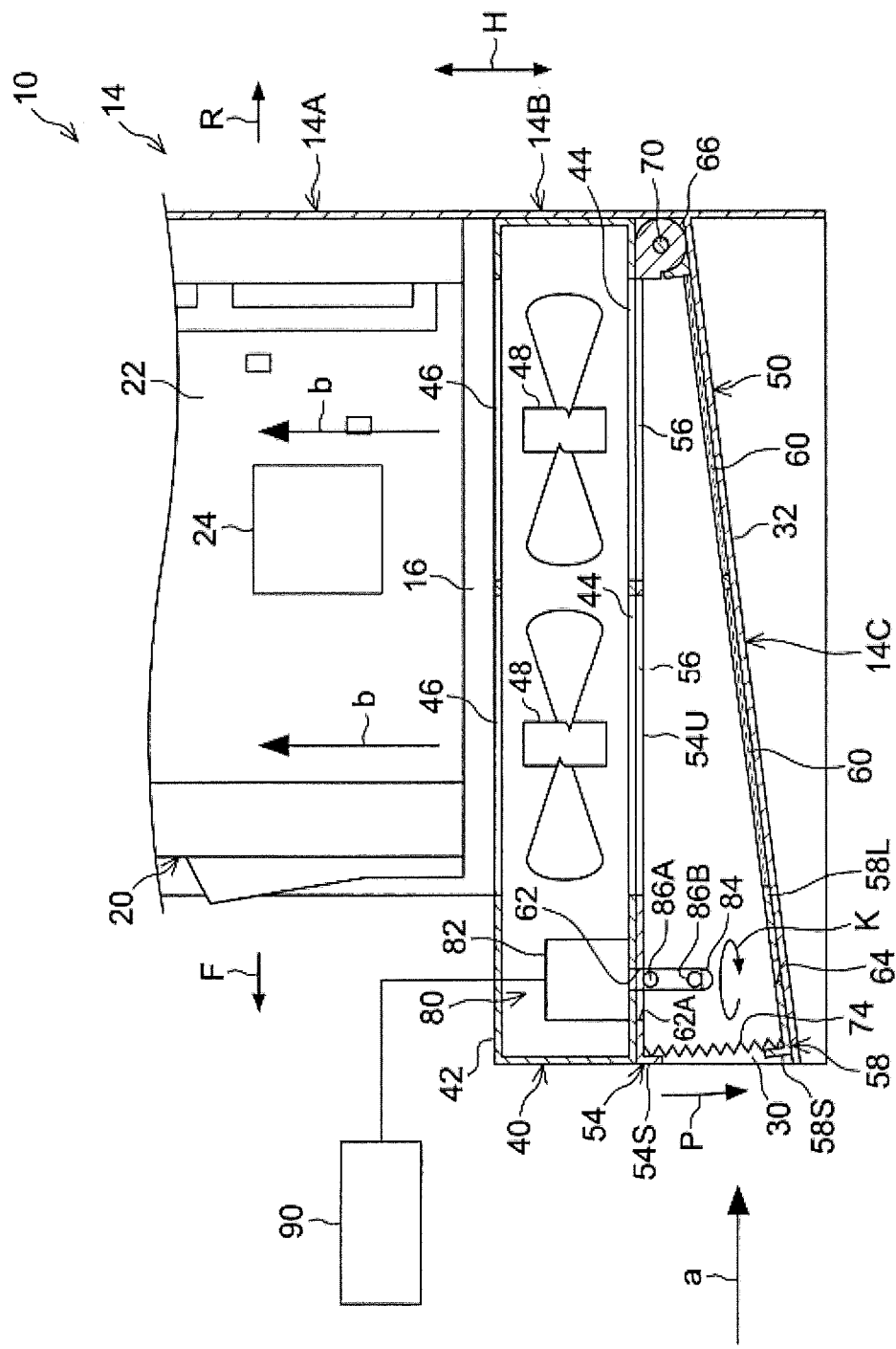

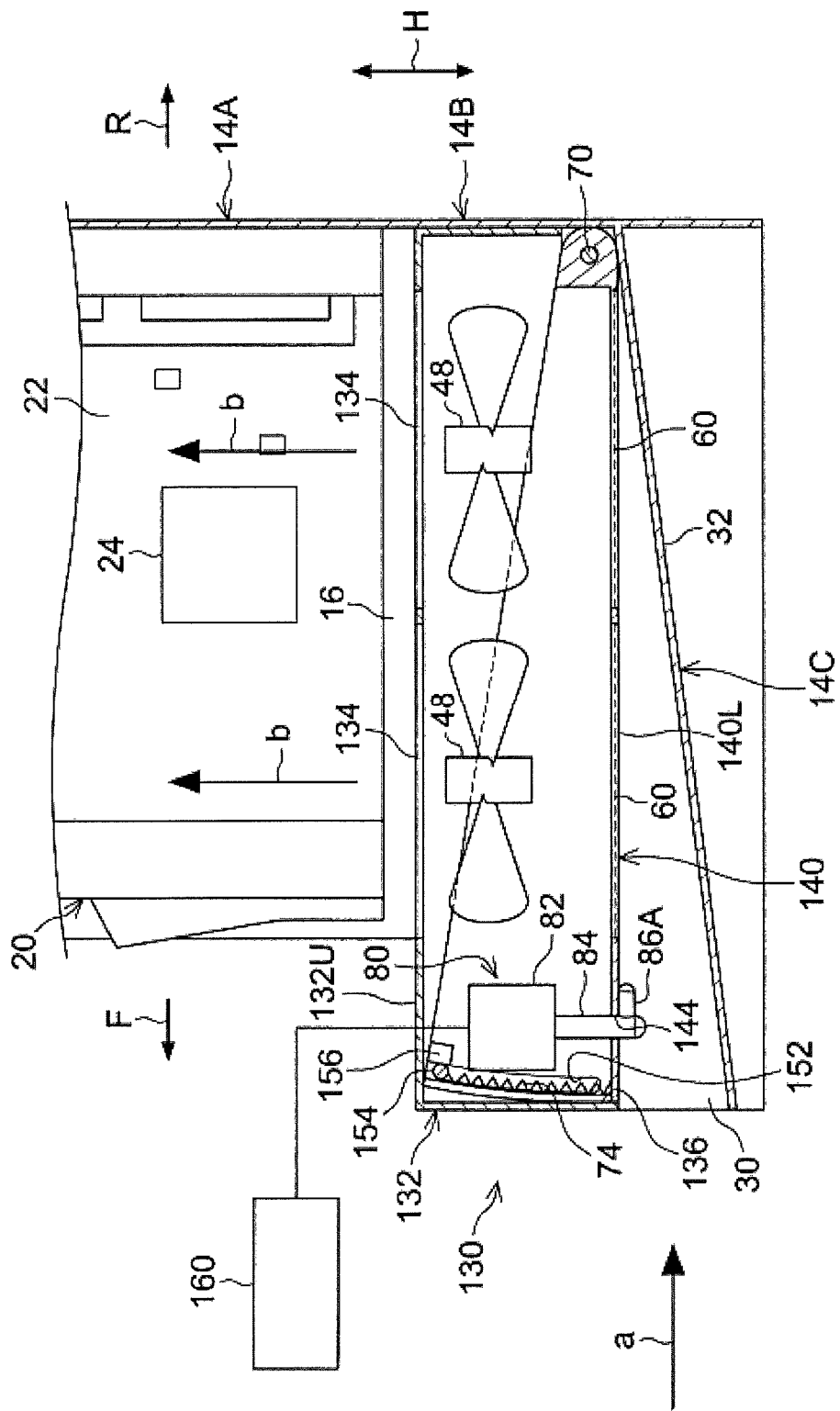

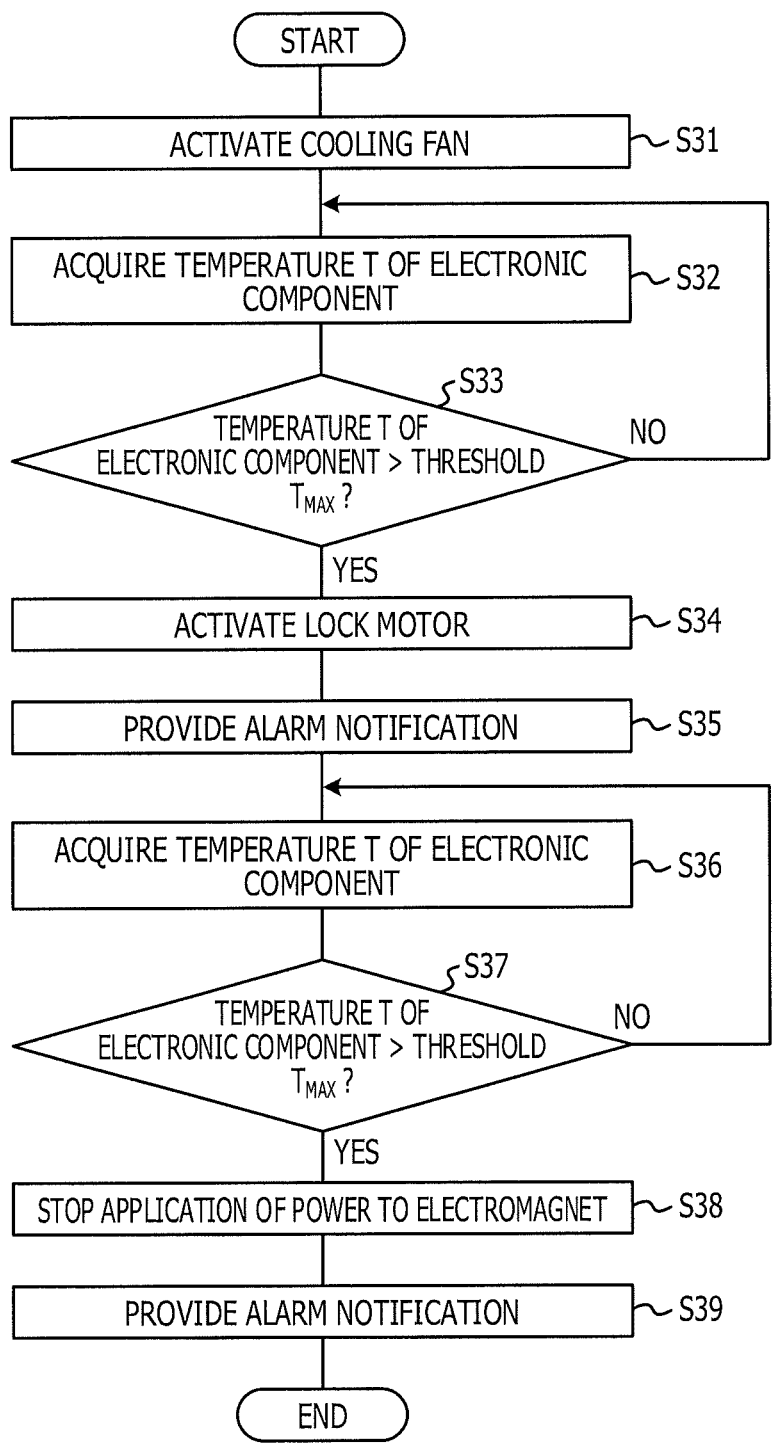

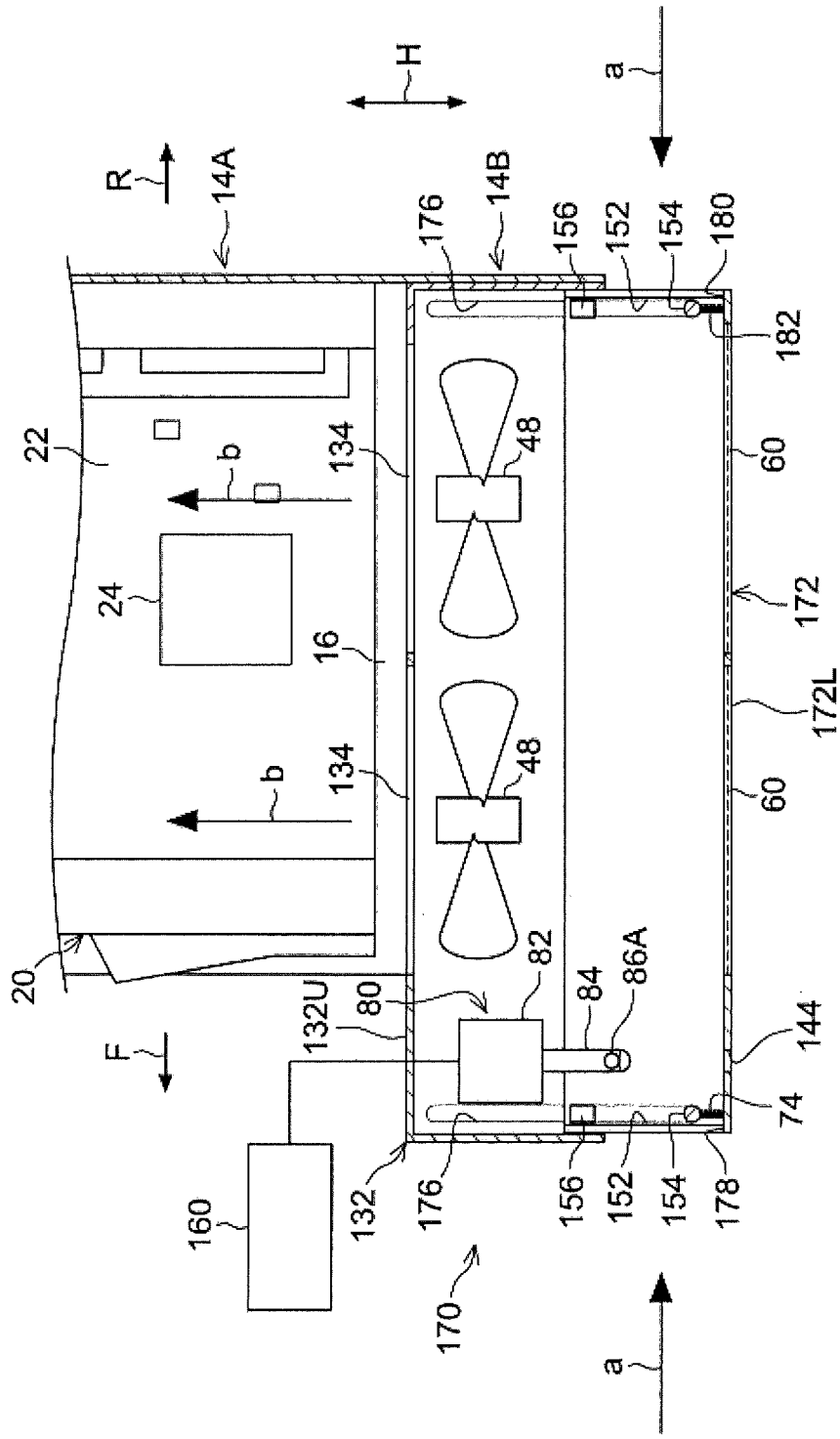

ELECTRONIC APPARATUS AND FILTER UNIT

CROSS-REFERENCE TO RELATED APPLICATION

This application is based upon and claims the benefit of priority of the prior Japanese Patent Application No. 2014-125475, filed on Jun. 18, 2014, the entire contents of which are incorporated herein by reference.

FIELD

The embodiments discussed herein are related to an electronic apparatus and a filter unit.

BACKGROUND

There is known an electronic apparatus that includes a housing and a filter. The housing accommodates an electronic component and has an air inlet for taking in outside air to cool the electronic component. The filter covers the air inlet. Techniques related to these configurations are discussed in, for example, Japanese Laid-open Patent Publication Nos. 2003-8272, 2007-115020, and 7-236805, as well as Japanese Unexamined Utility Model Registration Application Publication No. 4-123591.

When the filter is clogged with dirt and dust in the air, an amount of outside air taken into the housing through the air inlet decreases, which may reduce efficiency of cooling the electronic component. One of conceivable solutions to this issue is, for example, to uncover the air inlet by sliding the filter in a manner similar to moving a sliding door, relative to the air inlet. However, in this solution, it is desirable to provide a space for accommodating the filter at a position next to the air inlet, and therefore, the housing may become larger.

SUMMARY

According to an aspect of the invention, an electronic apparatus includes a housing that includes an air inlet, and an air-intake duct section provided to supply air to the air inlet, and a filter housing that houses a filter provided to cover the air inlet, and moves toward the air-intake duct section in a thickness direction of the filter housing, to shift from a closed state in which the filter covers the air inlet to an open state in which the air inlet is uncovered.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

BRIEF DESCRIPTION OF DRAWINGS

FIG. 5A is an enlarged sectional view of a part of FIG. 2, for describing operation of the filter unit;

FIG. 5B is an enlarged sectional view of the part of FIG. 2, for describing operation of the filter unit;

FIG. 16A is a sectional view corresponding to FIG. 5A, for describing operation of the filter unit illustrated in FIG. 14;

FIG. 17 is a flowchart illustrating a processing flow of a control section illustrated in FIG. 16A;

FIG. 19C is a sectional view corresponding to FIG. 5C, for describing operation of the filter unit illustrated in FIG. 18;

DESCRIPTION OF EMBODIMENTS

First, a first embodiment is described.

Figure 1:
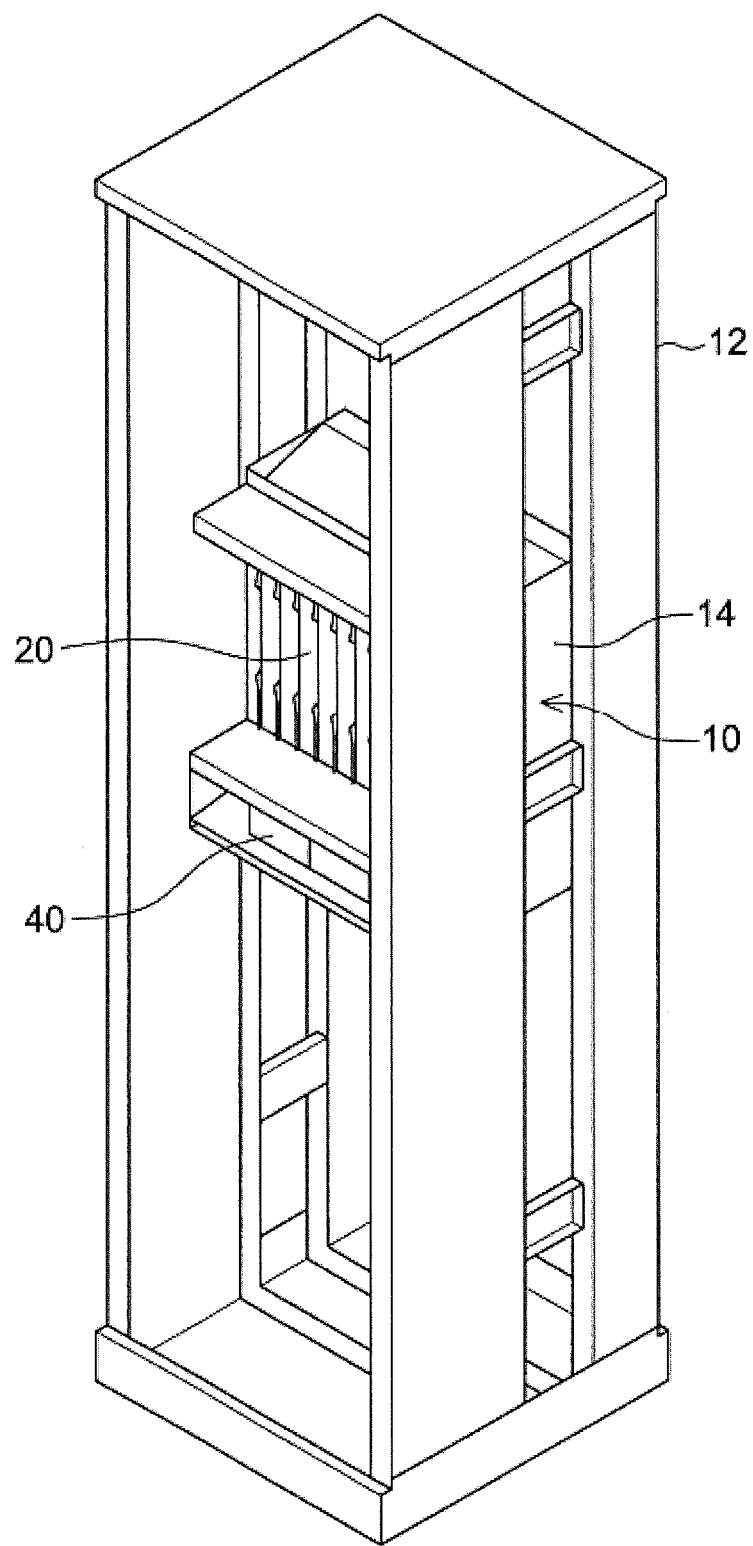
FIG. 1 is a perspective view of a rack that accommodates an electronic apparatus according to a first embodiment.

As illustrated in FIG. 1, an electronic apparatus 10 according to the present embodiment is mounted in a rack 12, for example. Two or more electronic apparatuses each equivalent to the electronic apparatus 10 may be mounted in the rack 12 in a height direction. In FIG. 1, the electronic apparatus 10 is mounted in a middle stage of the rack 12.

Figure 2:
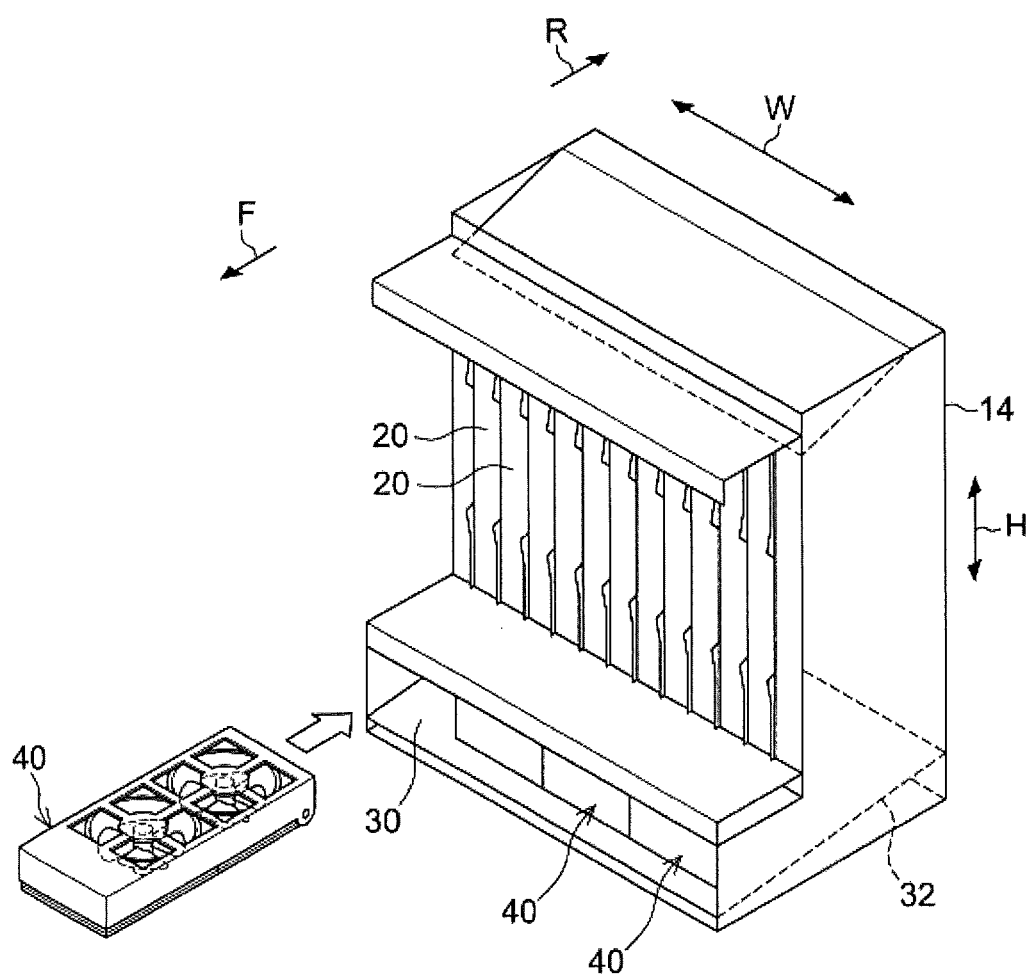
FIG. 2 is a perspective view of the electronic apparatus illustrated in FIG. 1.

As illustrated in FIG. 2, the electronic apparatus 10 includes a housing 14, expansion devices 20 housed in an upper part of the housing 14, and fan units 40 housed in a lower part of the housing 14 to cool the expansion devices 20. An arrow W illustrated in FIG. 2 indicates a width direction of the housing 14. Further, an arrow F indicates a front side of the housing 14, and an arrow R indicates a rear side of the housing 14. Furthermore, an arrow H indicates a height direction (a vertical direction) of the housing 14.

Figure 3:
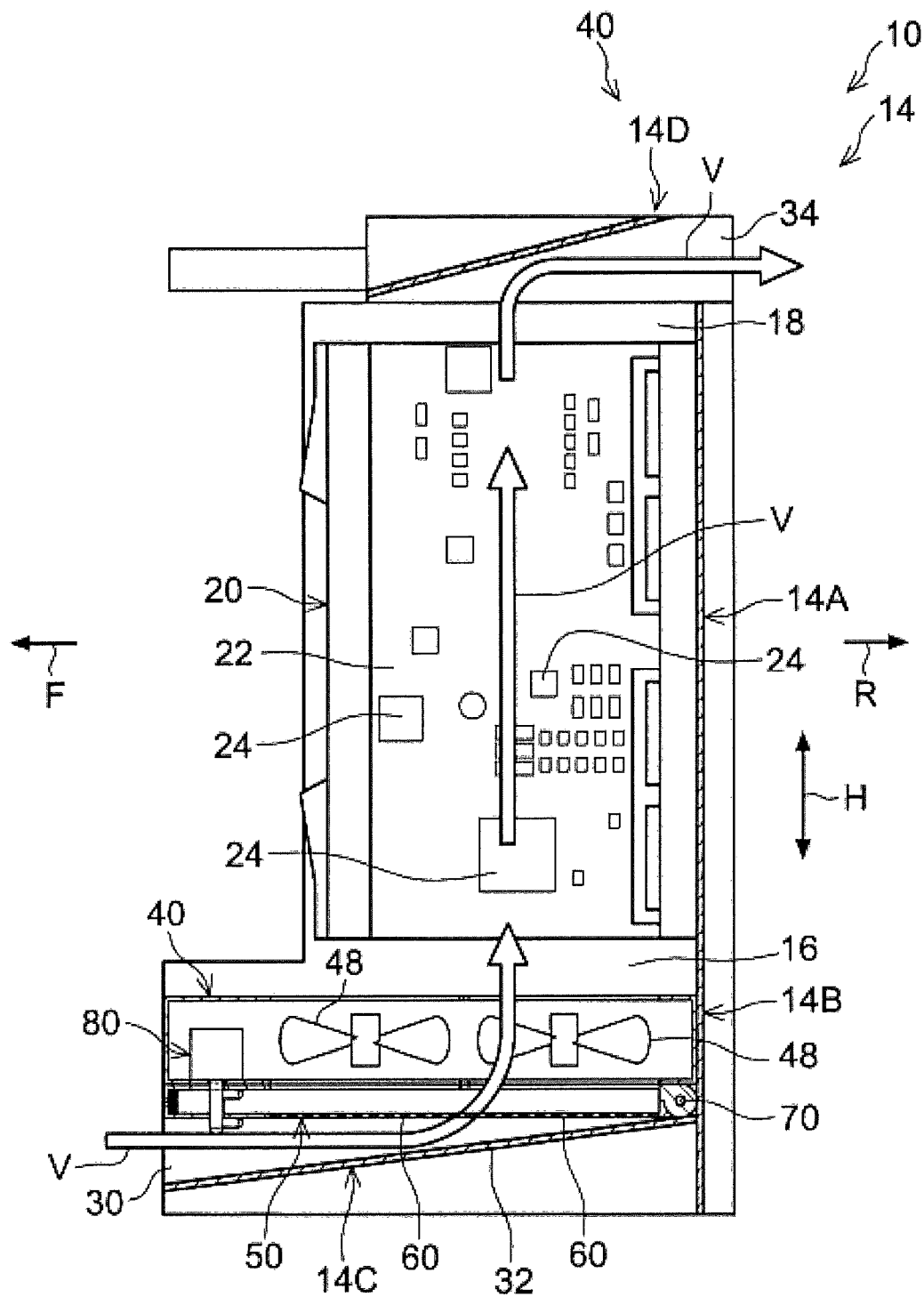
FIG. 3 is a vertical sectional view of the electronic apparatus illustrated in FIG. 2.

The housing 14 is formed like a box. As illustrated in FIG. 3, the housing 14 includes a heat-generating-body housing section 14A, a fan housing section 14B, an air-intake duct section 14C, and an air-exhaust duct section 14D.

In the heat-generating-body housing section 14A, the expansion devices 20 are housed in a state of being aligned in the width direction (the direction indicated by the arrow W in FIG. 2) of the housing 14. The heat-generating-body housing section 14A has an air inlet 16 connecting to the fan housing section 14B, and an air outlet 18 connecting to the air-exhaust duct section 14D. The air inlet 16 opens a lower part of the heat-generating-body housing section 14A downward. In other words, in the present embodiment, air taken in through the air inlet 16 is guided in the height direction (the direction indicated by the arrow H) of the housing 14. In this case, an opening direction (a penetration direction) of the air inlet 16 is equivalent to the height direction (the vertical direction) of the housing 14. On the other hand, the air outlet 18 opens an upper part of the heat-generating-body housing section 14A upward.

The expansion device 20 is, for example, a line card to be connected to an external transmission line in a transmission system. The expansion device 20 includes a board 22. For example, electronic components 24 such as a central processing unit (CPU) and a memory are mounted on the board 22. The electronic components 24 generate heat by consuming electric power. Further, a temperature sensor 88 (see FIG. 9) to be described later is attached to each of the electronic components 24. The electronic component 24 is an example of a heat generating body.

The fan housing section 14B is provided below the heat-generating-body housing section 14A. In the fan housing section 14B, the fan units 40 are housed in the width direction of the housing 14. The air-intake duct section 14C is provided below the fan housing section 14B.

The air-intake duct section 14C has an outside-air intake opening 30 that opens a front side in a lower part of the housing 14. Further, the air-intake duct section 14C includes a guide plate 32. The guide plate 32 slopes upward from the outside-air intake opening 30 to a rear side of the housing 14, and guides air (outside air) taken in through the outside-air intake opening 30 to the fan housing section 14B.

The air-exhaust duct section 14D is provided above the heat-generating-body housing section 14A. The air-exhaust duct section 14D has an inside-air exhaust opening 34 that opens a rear side in an upper part of the housing 14. Through the air-exhaust duct section 14D, air (heated air) inside the heat-generating-body housing section 14A is exhausted to the outside of the housing 14. In FIG. 3, arrows V each indicate a flow of the air inside the housing 14.

Here, the fan units 40 are housed in the fan housing section 14B, to cover the air inlet 16 of the heat-generating-body housing section 14A. The fan units 40 each suck the air from the air-intake duct section 14C, and send the sucked air to the heat-generating-body housing section 14A through the air inlet 16. The electronic components 24 in the heat-generating-body housing section 14A are thus cooled.

Figure 4:
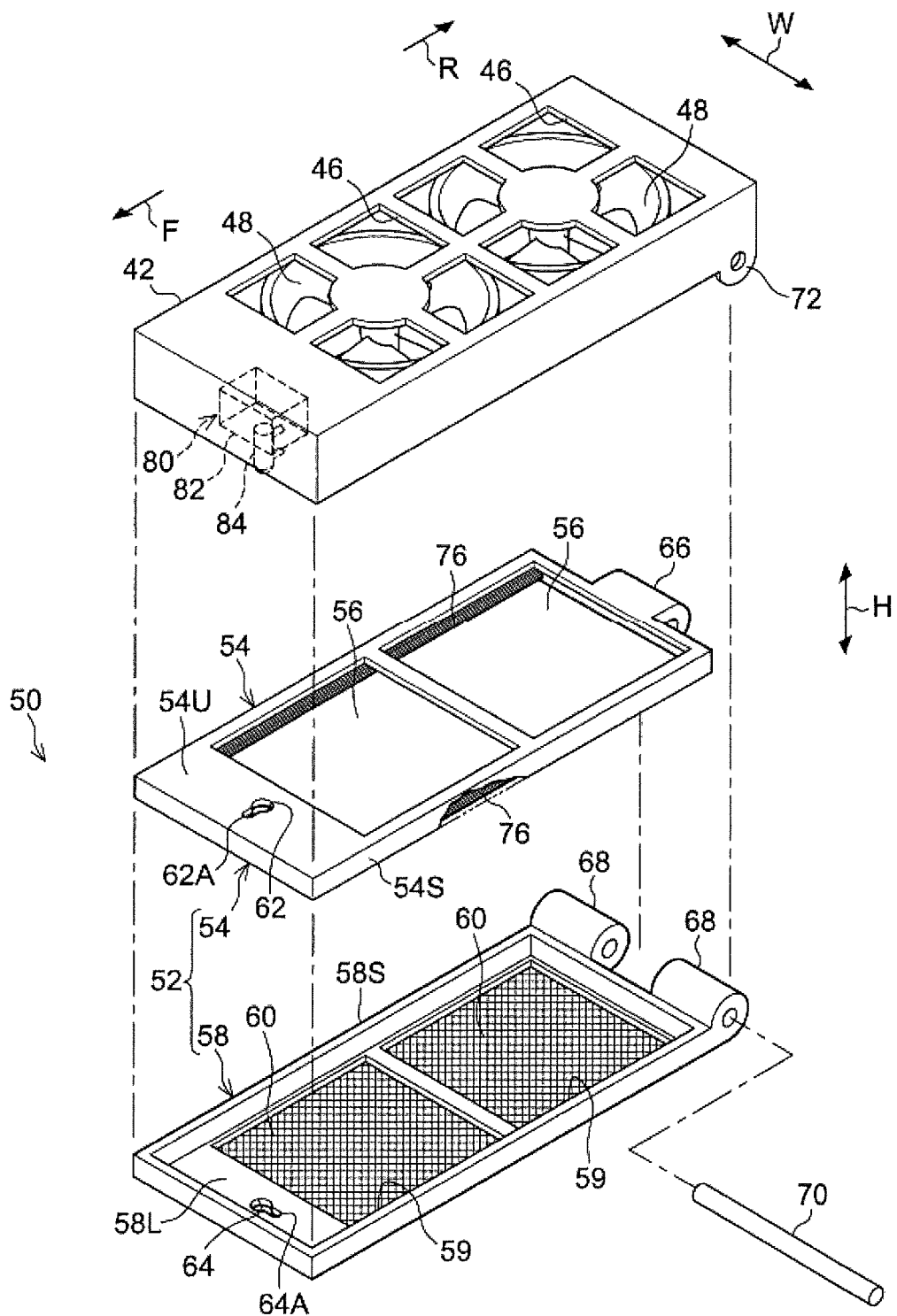
FIG. 4 is an exploded perspective view of each of fan units illustrated in FIG. 2.

As illustrated in FIG. 4, the fan unit 40 includes a fan case 42, a cooling fan 48, a filter unit 50, and a holding section 80. The fan case 42 is formed like a box.

As illustrated in FIG. 5A, a case entrance 44 connecting to the air-intake duct section 14C is formed in a lower-wall part of the fan case 42. On the other hand, case exits 46 connecting to the air inlet 16 of the heat-generating-body housing section 14A are formed in an upper-wall part of the fan case 42. The cooling fan 48 is housed in the fan case 42.

The cooling fan 48 includes components such as a fan motor (not illustrated). When the fan motor is activated, the air in the air-intake duct section 14C is sucked into the fan case 42 through the case entrance 44, and then sent from the case exit 46 to the heat-generating-body housing section 14A through the air inlet 16.

Further, a control section 90 to be described later is electrically connected to the cooling fan 48. Furthermore, in the present embodiment, two cooling fans 48 equivalent to the above-described cooling fan 48 are housed in the fan case 42. However, the number of the cooling fans 48 may be modified as appropriate.

As illustrated in FIG. 4, the filter unit 50 includes a filter housing 52, a filter 60, a front-face auxiliary filter 74 (see FIG. 5A), and a pair of side-face auxiliary filters 76. The filter housing 52 is formed like a box, and includes a first frame 54 and a second frame 58 vertically separated from each other. In the inside of the filter housing 52, the front-face auxiliary filter 74 and the pair of side-face auxiliary filters 76 are housed.

The first frame 54 includes a ceiling-wall section 54U and a side-peripheral-wall section 54S. In the ceiling-wall section 54U, frame openings 56 connecting to the fan case 42 are formed. The second frame 58 includes a filter housing section 58L forming a bottom-wall portion, and a side-peripheral-wall section 58S. In the filter housing section 58L, attachment openings 59 are formed to face the frame openings 56.

The filter 60 formed like a mesh is attached to each of the attachment openings 59. As illustrated in FIG. 5A, the filter 60 covers the air inlet 16 of the heat-generating-body housing section 14A from below (from outside of the heat-generating-body housing section 14A), and removes dirt and dust in the air that flows from the air-intake duct section 14C to the air inlet 16.

As illustrated in FIG. 4, engagement apertures 62 and 64 are formed on a front side of the ceiling-wall section 54U of the first frame 54 and on a front side of the filter housing section 58L of the second frame 58, respectively. As is described later, a rotation rod 84 of the holding section 80 is to be inserted into the engagement apertures 62 and 64. Long grooves 62A and 64A extending in different directions from each other are formed on an edge of the engagement aperture 62 and on an edge of the engagement aperture 64, respectively.

Further, the first frame 54 and the second frame 58 are connected to be turnable relative to each other. Specifically, hinge sections 66 and 68 each shaped like a cylinder are formed at a rear end part of the first frame 54 and at a rear end part of the second frame 58, respectively. The first frame 54 and the second frame 58 are connected to be turnable about a rotation shaft 70, when the rotation shaft 70 is inserted into these hinge sections 66 and 68.

Figure 5C:
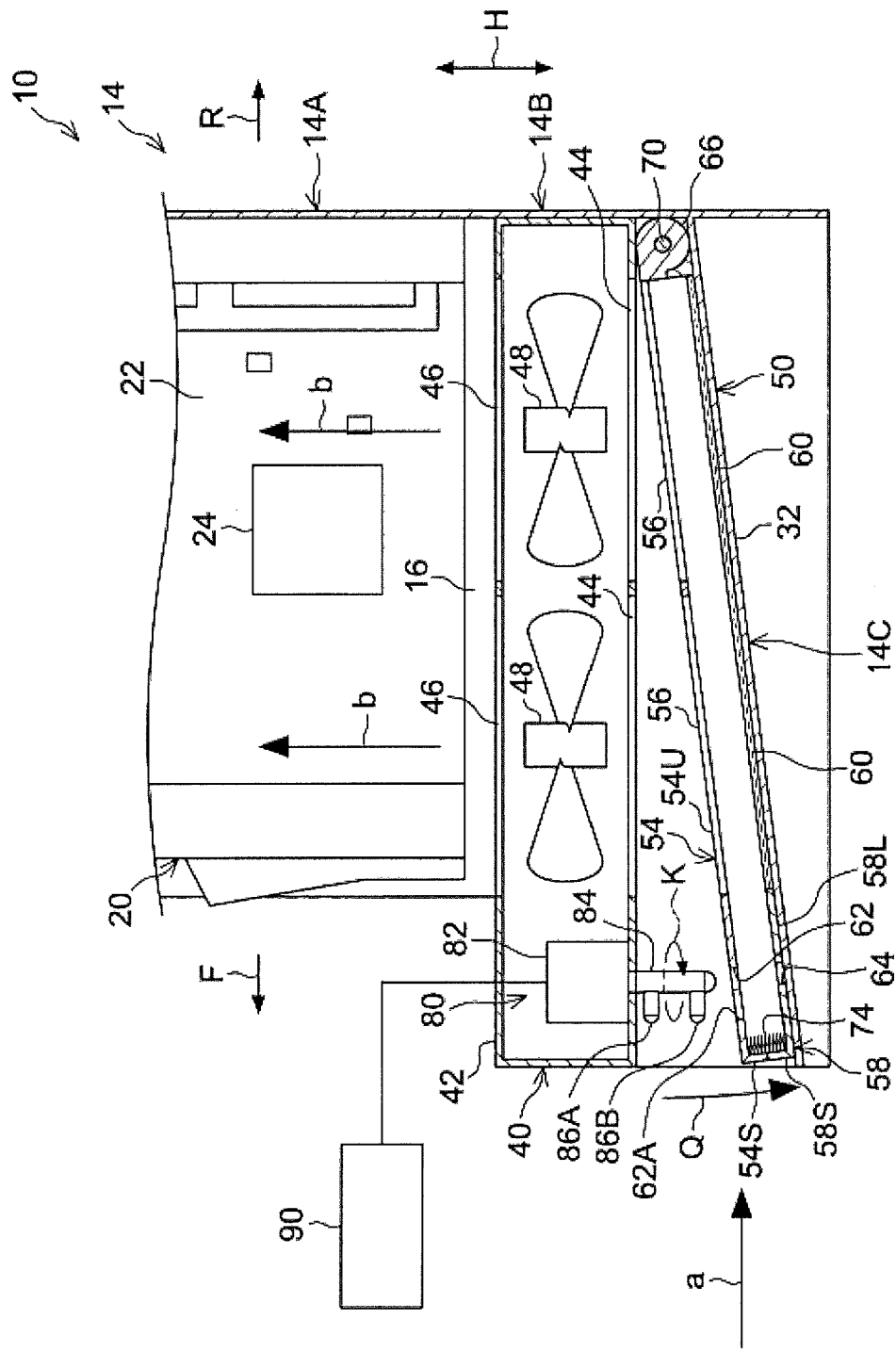
FIG. 5C is an enlarged sectional view of the part of FIG. 2, for describing operation of the filter unit.

The rotation shaft 70 is supported by a pair of bearing sections 72 formed at a rear end part of the fan case 42. Therefore, as illustrated in FIGS. 5B and 5C, the first frame 54 and the second frame 58 are supported by the fan case 42 via the rotation shaft 70, to be turnable in a thickness direction (a direction indicated by an arrow H) of the filter housing section 58L. When the second frame 58 turns downward about the rotation shaft 70, the second frame 58 moves outward (downward) from the heat-generating-body housing section 14A, namely, toward the air-intake duct section 14C. As a result, the filter housing section 58L shifts from a closed state (a position illustrated in FIG. 5A) in which the filter 60 covers the air inlet 16, to an open state (a position illustrated in FIGS. 5B and 5C) in which the air inlet 16 is uncovered. The thickness direction of the filter housing section 58L is, for example, an air-intake direction of the filter 60.

Figure 6:
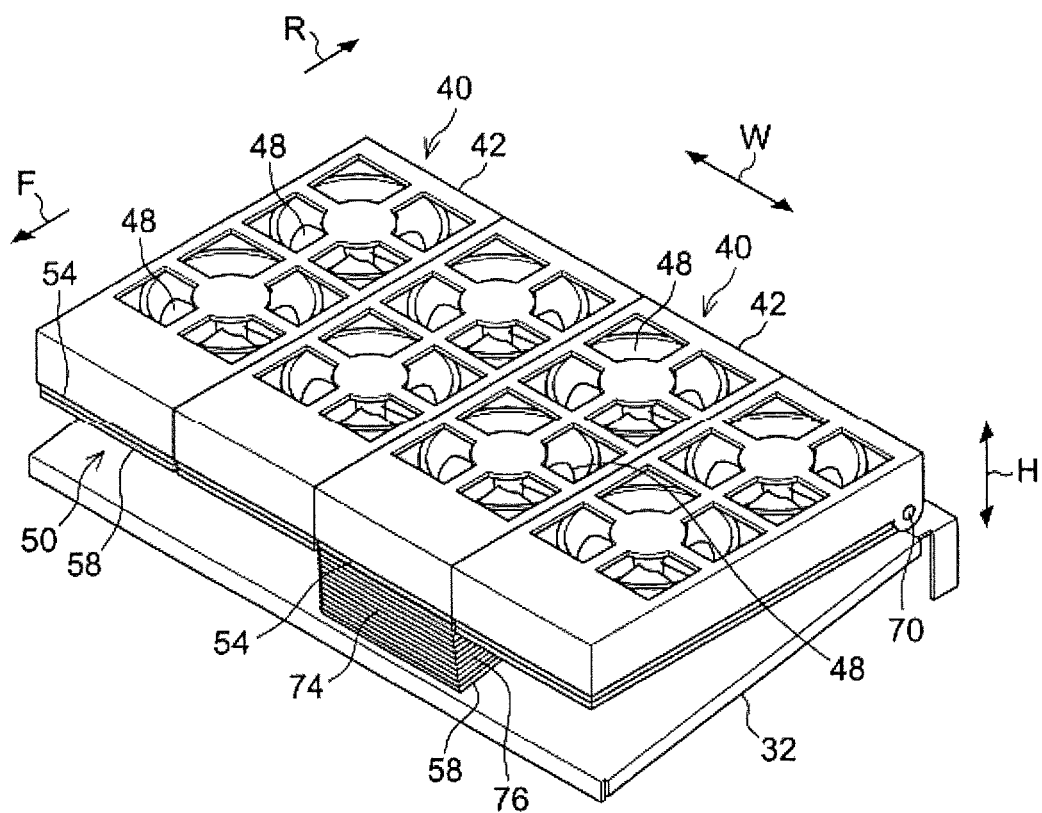
FIG. 6 is a perspective view of the fan units illustrated in FIG. 2.
Figure 7A:
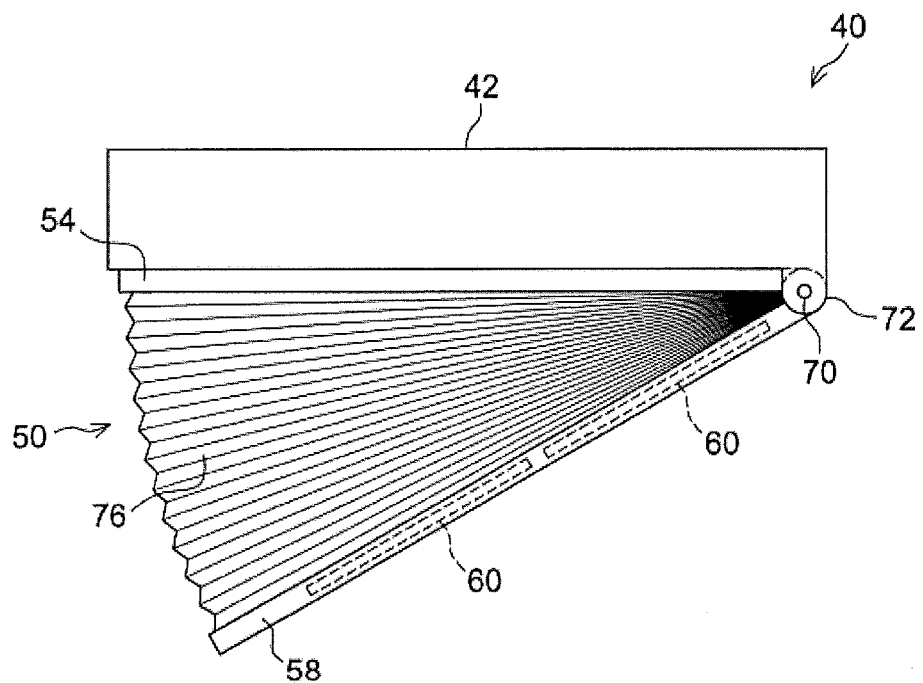
FIG. 7A is a side view of each of the fan units illustrated in FIG. 6.
Figure 7B:
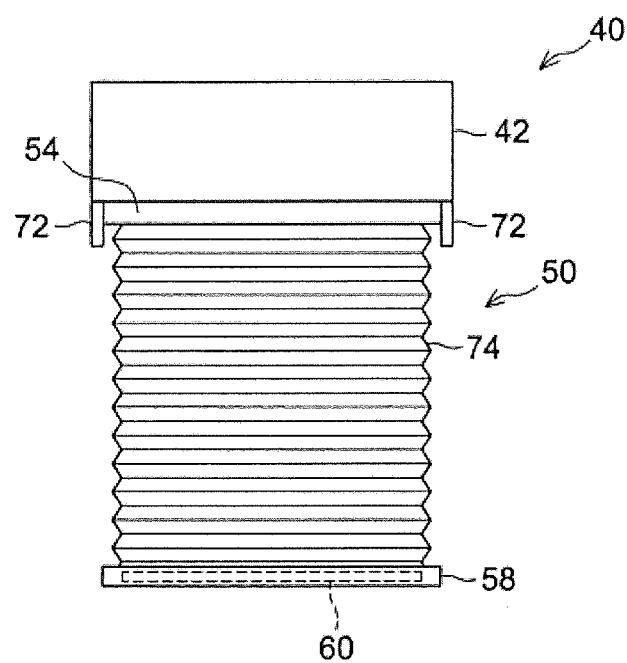
FIG. 7B is a front view of each of the fan units illustrated in FIG. 6.

As illustrated in FIGS. 6, 7A, and 7B, the front-face auxiliary filter 74 and the pair of side-face auxiliary filters 76, serving as an example of an auxiliary filter, are housed between the first frame 54 and the second frame 58. The front-face auxiliary filter 74 and the pair of side-face auxiliary filters 76 are each formed like a mesh as well as being formed like bellows. The front-face auxiliary filter 74 is housed in a folded state between a front end side of the first frame 54 and a front end side of the second frame 58 (on a side opposite the rotation shaft 70). An upper end part and a lower end part of the front-face auxiliary filter 74 are fixed to the first frame 54 and the second frame 58, respectively. Each of the pair of side-face auxiliary filters 76 is housed in a folded state between a side part of the first frame 54 and a side part of the second frame 58. An upper end part and a lower end part of each of the pair of side-face auxiliary filters 76 are fixed to the first frame 54 and the second frame 58, respectively.

When the second frame 58 turns downward relative to the first frame 54, the front-face auxiliary filter 74 and the pair of side-face auxiliary filters 76 expand between the first frame 54 and the second frame 58. Further, as illustrated in FIG. 5C, when the first frame 54 turns toward the second frame 58 relative to the air inlet 16, the front-face auxiliary filter 74 and the pair of side-face auxiliary filters 76 are housed between the first frame 54 and the second frame 58. In FIGS. 5A, 5B, and 5C, illustration of the side-face auxiliary filters 76 is omitted.

As illustrated in FIG. 5A, the holding section 80 includes a lock motor 82 and the rotation rod 84. The lock motor 82 is, for example, a stepping motor. The lock motor 82 is an example of a driving device that drives the rotation rod 84 to rotate. The lock motor 82 is housed on a front side of the fan case 42.

The rotation rod 84 extends downward from the lock motor 82, and is inserted into the engagement aperture 62 of the first frame 54 and the engagement aperture 64 of the second frame 58. The rotation rod 84 has a pair of holding pins 86A and 86B that hold the first frame 54 and the second frame 58, respectively.

Figure 8A:
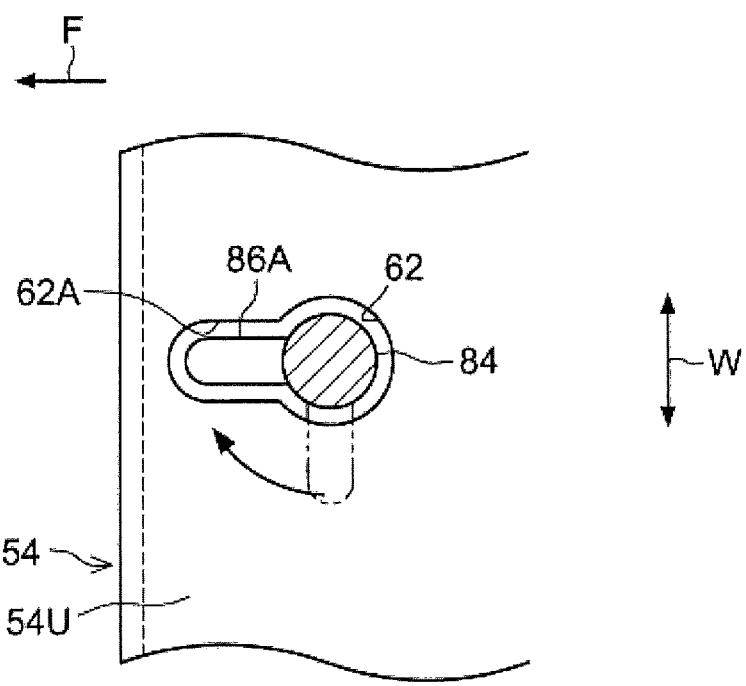
FIG. 8A is a plan view of a holding pin illustrated in FIG. 5C.

The pair of holding pins 86A and 86B are arranged in an axial direction of the rotation rod 84 with a space therebetween, to protrude from the rotation rod 84 in different directions. As illustrated in FIG. 8A, the holding pin 86A is inserted into the long groove 62A formed on the edge of the engagement aperture 62 of the first frame 54, and is engaged with the edge of the engagement aperture 62 as a result of the rotation of the rotation rod 84.

Figure 8B:
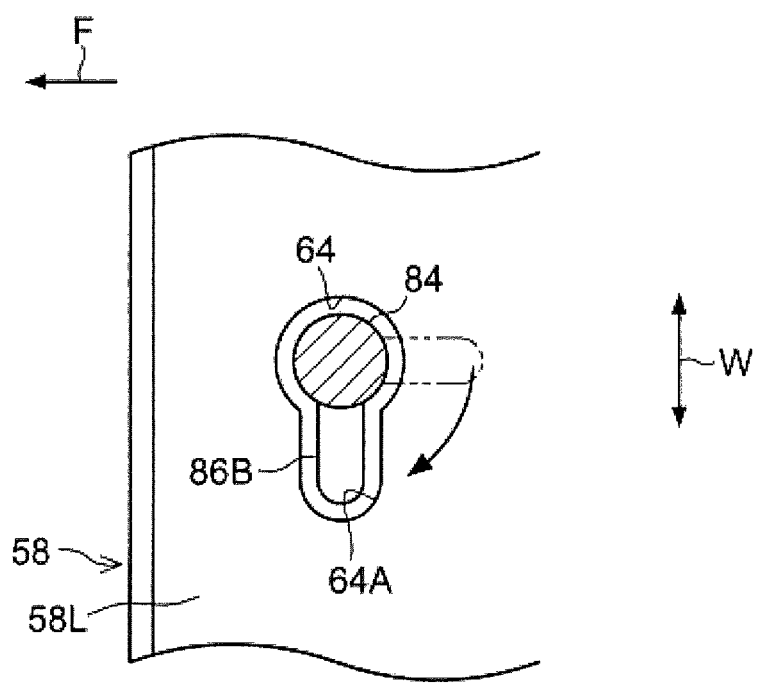
FIG. 8B is a plan view of the holding pin illustrated in FIG. 5B.

On the other hand, the holding pin 86B is located closer to a tip side of the rotation rod 84 than the holding pin 86A. As illustrated in FIG. 8B, the holding pin 86B is inserted into the long groove 64A formed on the edge of the engagement aperture 64 of the second frame 58, and is engaged with the edge of the engagement aperture 64 as a result of the rotation of the rotation rod 84.

Figure 9:
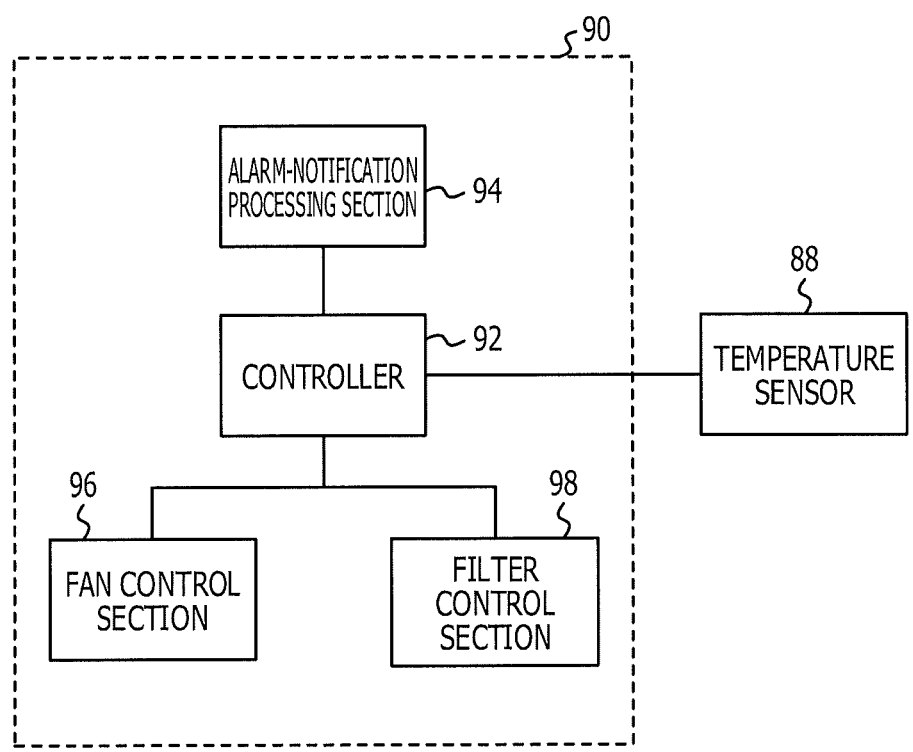
FIG. 9 is a functional block diagram illustrating a function of a control section illustrated in FIG. 5A.

As illustrated in FIG. 9, the electronic apparatus 10 includes the temperature sensor 88 and the control section 90. The temperature sensor 88 detects a temperature of each of the electronic components 24 (see FIG. 5A) in the expansion device 20, and outputs a result of this detection to the control section 90. The temperature sensor 88 is an example of a temperature detection section.

The control section 90 includes a controller 92, an alarm-notification processing section 94, a fan control section 96, and a filter control section 98. The controller 92 transmits a control signal to each of the alarm-notification processing section 94, the fan control section 96, and the filter control section 98, based on the temperature (temperature information) of the electronic component 24 which is detected by the temperature sensor 88.

The alarm-notification processing section 94 transmits alarm information to a monitoring terminal 110 (see FIG. 10) to be described later, based on the control signal from the controller 92. This alarm information includes, for example, a message prompting for replacement of the filter 60, and the like. The fan control section 96 activates the fan motor of the cooling fan 48, based on the control signal from the controller 92. The filter control section 98 activates the lock motor 82 of the holding section 80, based on the control signal from the controller 92.

Figure 10:
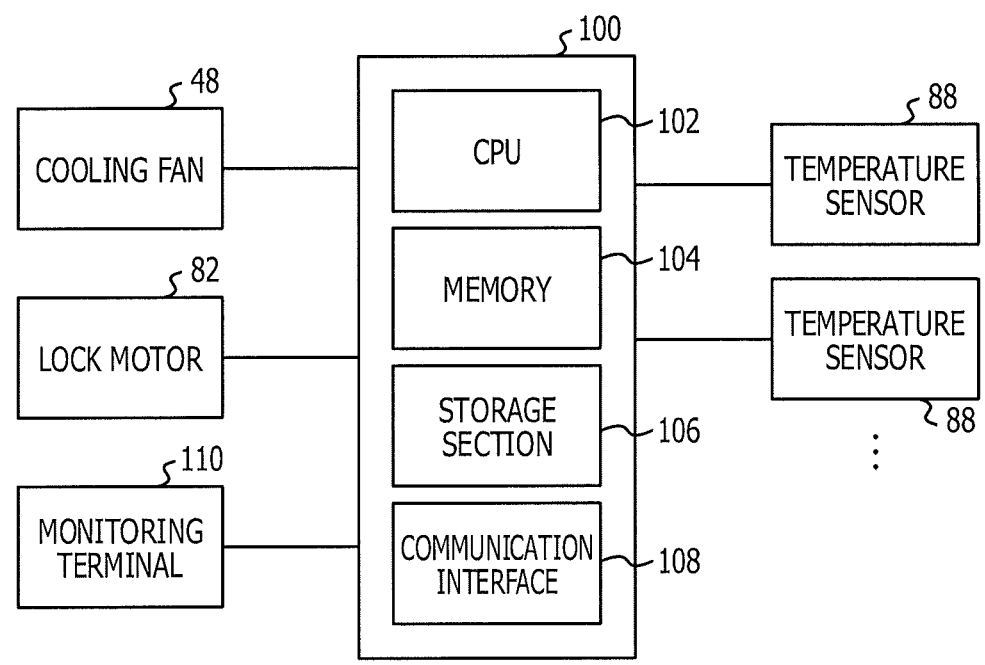
FIG. 10 is a hardware configuration diagram illustrating an example of hardware implementing the control section illustrated in FIG. 9.

The control section 90 is implemented by, for example, a computer 100 illustrated in FIG. 10. The computer 100 includes a CPU 102, a memory 104, a storage section 106, a communication interface 108, and the like. The CPU 102, the memory 104, the storage section 106, and the communication interface 108 are interconnected via a bus (not illustrated). Further, the temperature sensors 88, the cooling fan 48, and the lock motor 82 of the holding section 80 are connected to the computer 100.

The storage section 106 is implemented by, for example, a hard disk drive (HDD), a flash memory, or the like. The storage section 106 stores a control program for controlling the electronic apparatus 10. Further, the CPU 102 reads the control program from the storage section 106, and executes each step to be described later of the control program, by developing the control program in the memory 104. Furthermore, the storage section 106 stores a threshold $T_{MAX}$ of a temperature of each of the electronic components 24. The communication interface 108 is connected to the monitoring terminal 110 via a network (not illustrated).

Next, operation of the control section 90 is described.

FIG. 5A illustrates an initial state of the fan unit 40. In this initial state, the first frame 54 and the second frame 58 of the filter unit 50 are held by the holding pins 86A and 86B of the holding section 80, and the filter 60 is in the closed state of covering the air inlet 16, as illustrated in FIG. 5A. Further, the front-face auxiliary filter 74 and the pair of side-face auxiliary filters 76 are housed in the folded state between the first frame 54 and the second frame 58.

In this state, the control section 90 activates the cooling fan 48 of the fan unit 40, to cool the electronic components 24 of the heat-generating-body housing section 14A. Further, the control section 90 monitors a temperature T of each of the electronic components 24, and controls the fan unit 40 so that the temperature T of each of the electronic components 24 remains below the threshold $T_{MAX}$.

A case where the control section 90 monitors the temperature T of one of the electronic components 24 is described below as an example. However, the control section 90 may monitor the temperatures T of the respective electronic components 24. Further, each step to be executed by the control section 90 is described below with reference to FIG. 11.

In step S1, the control section 90 activates the fan motor of the cooling fan 48 at a certain number of revolutions, by transmitting a control signal to the fan control section 96. As a result, air (outside air) is sucked into the air-intake duct section 14C through the outside-air intake opening 30, as indicated by an arrow "a" in FIG. 5A. The air sucked into the air-intake duct section 14C is sent to the heat-generating-body housing section 14A through the air inlet 16, upon passing through the fan unit 40, as indicated by an arrow "b". During this process, the filter 60 removes dirt and dust in the air. The air taken into the heat-generating-body housing section 14A is exhausted from the inside-air exhaust opening 34 to the outside of the housing 14, through the air outlet 18 and the air-exhaust duct section 14D. Each of the electronic components 24 in the heat-generating-body housing section 14A is thus cooled.

Here, when the filter 60 is clogged with the dirt and dust in the air, the amount of air supplied from the air-intake duct section 14C to the air inlet 16 decreases, which may reduce efficiency of cooling the electronic component 24. Therefore, in step S2, the control section 90 acquires the temperature (temperature information) T, which is detected by the temperature sensor 88, of the electronic component 24.

Next, in step S3, the control section 90 determines whether the temperature T, which is detected by the temperature sensor 88, of the electronic component 24 exceeds the threshold $T_{MAX}$. In other words, in the present embodiment, the control section 90 indirectly monitors whether the filter 60 is clogged, based on the temperature T of the electronic component 24. When the temperature T of the electronic component 24 is the threshold $T_{MAX}$ or below ($T \leq T_{MAX}$), the control section 90 executes processing of step S2 again. Here, the processing of acquiring the temperature T of the electronic component 24 may be performed at regular time intervals, for example.

On the other hand, when the temperature T of the electronic component 24 exceeds the threshold $T_{MAX}$ ($T>T_{MAX}$), the control section 90 increases the number of revolutions of the fan motor in the cooling fan 48, by transmitting a control signal to the fan control section 96, in step S4. This increases the amount of the air supplied from the air-intake duct section 14C to the air inlet 16, thereby cooling the electronic component 24.

Next, in step S5, the control section 90 causes alarm information to be transmitted to the monitoring terminal 110, by transmitting a control signal to the alarm-notification processing section 94. This causes, for example, a monitor of the monitoring terminal 110 to display a message prompting for replacement of the filter 60.

The processing of increasing the number of revolutions of the fan motor in the cooling fan 48 in step S4 may be performed in two or more stages to increase the number of revolutions of the fan motor up to a maximum number of revolutions of the fan motor. In this case, the processing in each of steps S2 and S3 may be performed in each of these stages. Further, the control section 90 may perform control to proceed to the processing in step S5 or after, when the number of revolutions of the fan motor reaches the maximum number of revolutions.

Here, when replacement of the filter 60 by an administrator of the electronic apparatus 10 is late, the temperature T of the electronic component 24 may rise because clogging of the filter 60 becomes more severe. Therefore, in step S6, the control section 90 acquires again the temperature T, which is detected by the temperature sensor 88, of the electronic component 24.

Next, in step S7, the control section 90 determines whether the temperature T, which is detected by the temperature sensor 88, of the electronic component 24 exceeds the threshold $T_{MAX}$. When the temperature T of the electronic component 24 is the threshold $T_{MAX}$ or below ($T \leq T_{MAX}$), the control section 90 executes the processing of step S6 again.

On the other hand, when the temperature T of the electronic component 24 exceeds the threshold $T_{MAX}$ ($T>T_{MAX}$), the control section 90 transmits a control signal to the filter control section 98 in step S8. This activates the lock motor 82, so that the rotation rod 84 rotates for a certain amount as indicated by an arrow K in FIG. 5B. As illustrated in FIG. 8B, when the holding pin 86B of the rotation rod 84 arrives at the long groove 64A formed on the edge of the engagement aperture 64 of the second frame 58 due to the rotation of the rotation rod 84, a state of engagement between the holding pin 86B and the second frame 58 is released.

As a result, the second frame 58 turns downward about the rotation shaft 70 due to self-weight as indicated by an arrow P in FIG. 5B, so that the second frame 58 is positioned along the guide plate 32. In other words, the filter housing section 58L shifts from the closed state (the position illustrated in FIG. 5A) in which the filter 60 covers the air inlet 16, to the open state (the position illustrated in FIG. 5B) in which the air inlet 16 is uncovered. Therefore, the filter 60, which is assumed, based on the temperature T exceeding the threshold $T_{MAX}$, to have clogging stops being involved in the intake of the outside air into the heat-generating-body housing section 14A. As a result, the amount of the air supplied from the air-intake duct section 14C to the air inlet 16a increases, which suppresses a reduction in the efficiency of cooling the electronic component 24.

In addition, the front-face auxiliary filter 74 and the pair of side-face auxiliary filters 76 (see FIG. 6) expand between the first frame 54 and the second frame 58, when the second frame 58 turns downward. Therefore, dirt and dust in the air to be supplied from the air-intake duct section 14C to the air inlet 16 are removed by the front-face auxiliary filter 74 and the pair of side-face auxiliary filters 76. Accordingly, trouble such as a malfunction of the electronic component 24 is suppressed.

Next, in step S9, the control section 90 causes alarm information to be transmitted to the monitoring terminal 110, by transmitting a control signal to the alarm-notification processing section 94. This causes, for example, the monitor of the monitoring terminal 110 to display a message or the like indicating that the front-face auxiliary filter 74 and the like are expanded.

Here, when the front-face auxiliary filter 74 and the pair of side-face auxiliary filters 76 are clogged with dirt and dust in the air as time goes by, the temperature T of the electronic component 24 may rise due to a decrease in the amount of air supplied from the air-intake duct section 14C to the air inlet 16. Therefore, in step S10, the control section 90 acquires again the temperature T, which is detected by the temperature sensor 88, of the electronic component 24.

Next, in step S11, the control section 90 determines whether the temperature T, which is detected by the temperature sensor 88, of the electronic component 24 exceeds the threshold $T_{MAX}$. When the temperature T of the electronic component 24 is the threshold $T_{MAX}$ or below ($T \leq T_{MAX}$), the control section 90 executes the processing of step S10 again.

On the other hand, when the temperature T of the electronic component 24 exceeds the threshold $T_{MAX}$ ($T > T_{MAX}$), the control section 90 transmits a control signal to the filter control section 98 in step S12. This activates the lock motor 82, so that the rotation rod 84 rotates for a certain amount as indicated by an arrow K in FIG. 5C. As illustrated in FIG. 8A, when the holding pin 86A of the rotation rod 84 arrives at the long groove 62A formed on the edge of the engagement aperture 62 of the first frame 54 due to the rotation of the rotation rod 84, a state of engagement between the holding pin 86A and the first frame 54 is released.

This allows the first frame 54 to turn downward about the rotation shaft 70 due to self-weight, so that the first frame 54 moves toward the second frame 58. As a result, the front-face auxiliary filter 74 and the pair of side-face auxiliary filters 76 are housed in the folded state between the first frame 54 and the second frame 58, and the air inlet 16 is uncovered. Therefore, the amount of air supplied from the air-intake duct section 14C to the air inlet 16 increases, which suppresses a reduction in the efficiency of cooling the electronic component 24.

Next, in step S13, the control section 90 causes alarm information to be transmitted to the monitoring terminal 110, by transmitting a control signal to the alarm-notification processing section 94. This causes, for example, the monitor of the monitoring terminal 110 to display a message indicating that the front-face auxiliary filter 74 and the like are housed.

Next, effects of the first embodiment are described.

As described above, according to the present embodiment, the air inlet 16 is uncovered by the movement of the filter 60 in the thickness direction (the direction indicated by the arrow H) of the filter housing section 58L. Here, for example, in a configuration of laterally sliding the filter 60 (for example, a front-back direction of the housing 14) relative to the air inlet 16 in a manner similar to moving a sliding door, it is desirable to form a space next to the air inlet 16, for accommodating the filter 60.

In contrast, in the present embodiment, the filter housing section 58L moves toward the air-intake duct section 14C in the thickness direction of the filter housing section 58L. The air inlet 16 is thus uncovered. Therefore, forming a space next to the air inlet 16 to accommodate the filter 60 may be avoided, which allows the housing 14 to be reduced in size in the front-back direction.

In addition, in the present embodiment, an amount of movement of the filter 60 to uncover the air inlet 16 is small, as compared with the configuration of sliding the filter 60 relative to the air inlet 16. This allows the heat-generating-body housing section 14A to be reduced in size in a height direction. Moreover, the filter 60 moves outward from the heat-generating-body housing section 14A (toward the air-intake duct section 14C) relative to the air inlet 16. Therefore, a space for accommodating the filter 60 in the heat-generating-body housing section 14A may be avoided, which allows a further size reduction of the heat-generating-body housing section 14A in the height direction.

Further, in the present embodiment, the second frame 58 and the filter 60 are allowed to move in the thickness direction of the filter housing section 58L relative to the first frame 54, due to self-weight. Therefore, a movement mechanism of the filter 60 may be simplified.

Furthermore, the filter housing section 58L is positioned along the guide plate 32 in the open state. Therefore, an adverse effect on the flow of the air in the air-intake duct section 14C is small, even if the filter housing section 58L is shifted from the closed state to the open state.

Besides, in the present embodiment, the front-face auxiliary filter 74 and the pair of side-face auxiliary filters 76 expand between the first frame 54 and the second frame 58, when the second frame 58 turns downward relative to the first frame 54. Therefore, dirt, dust, and the like in the air to be supplied from the air-intake duct section 14C to the air inlet 16 are removed by the front-face auxiliary filter 74 and the pair of side-face auxiliary filters 76. Accordingly, trouble such as a malfunction of the electronic component 24 may be suppressed.

Further, when the first frame 54 moves toward the filter housing section 58L (toward the open state) relative to the air inlet 16, the front-face auxiliary filter 74 and the pair of side-face auxiliary filters 76 are housed between the first frame 54 and the second frame 58, so that the air inlet 16 is uncovered. Therefore, a reduction in the efficiency of cooling the electronic component 24 may be suppressed, even if clogging occurs in the front-face auxiliary filter 74 and the pair of side-face auxiliary filters 76.

Next, a modification of the first embodiment is described.

Figure 12:
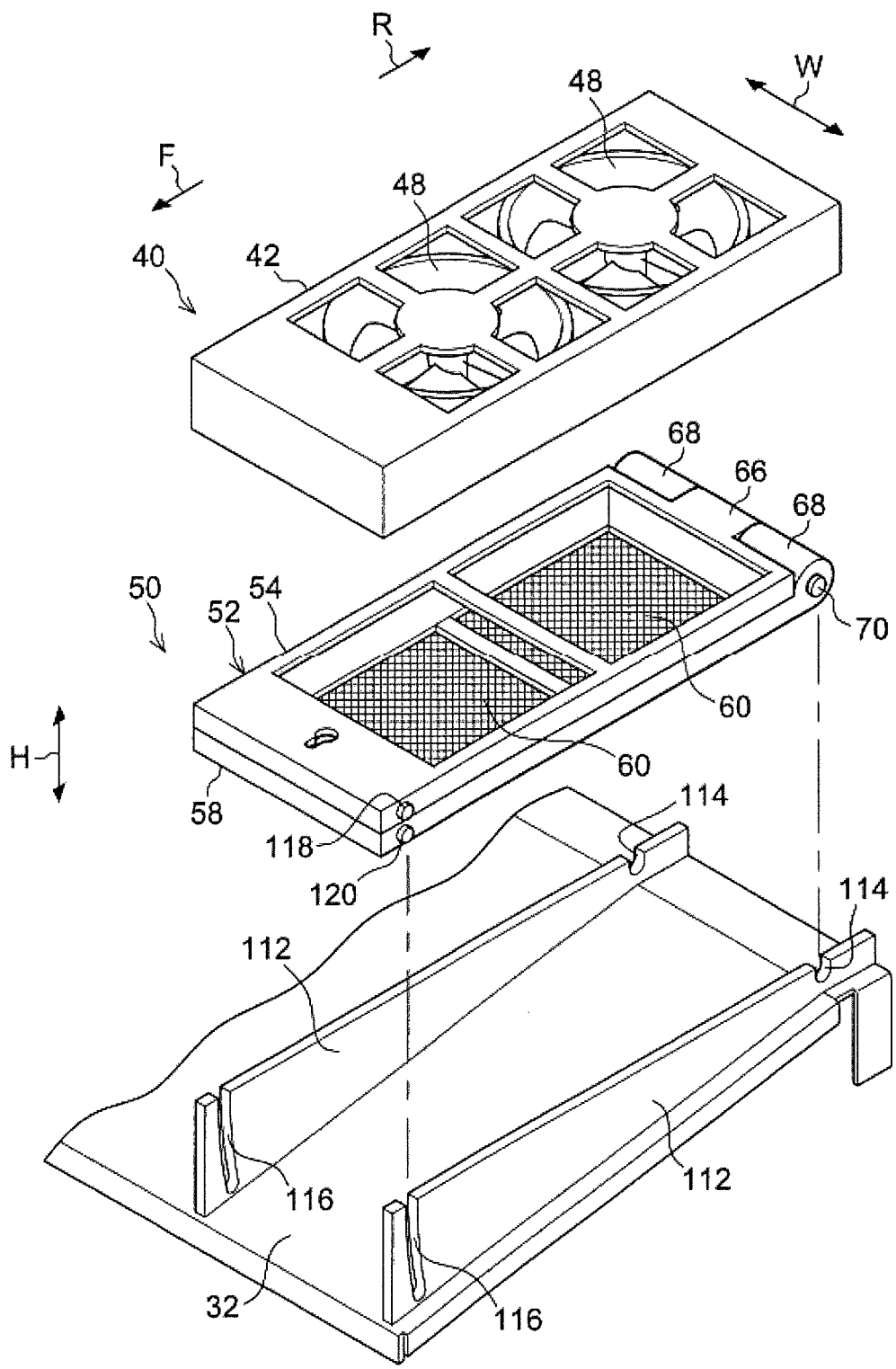
FIG. 12 is an exploded perspective view illustrating a modification of the fan unit illustrated in FIG. 4.

As illustrated in FIG. 12, for example, the guide plate 32 may have a guide groove 116 provided to guide movement of the first frame 54 and the second frame 58. Specifically, the guide plate 32 include a pair of partition plates 112 that separate a part of the air-intake duct section 14C from another in the width direction (a direction indicated by an arrow W) of the housing 14. A bearing section 114 of the rotation shaft 70 is provided on a rear end side of each of the pair of partition plates 112.

Figure 13A:
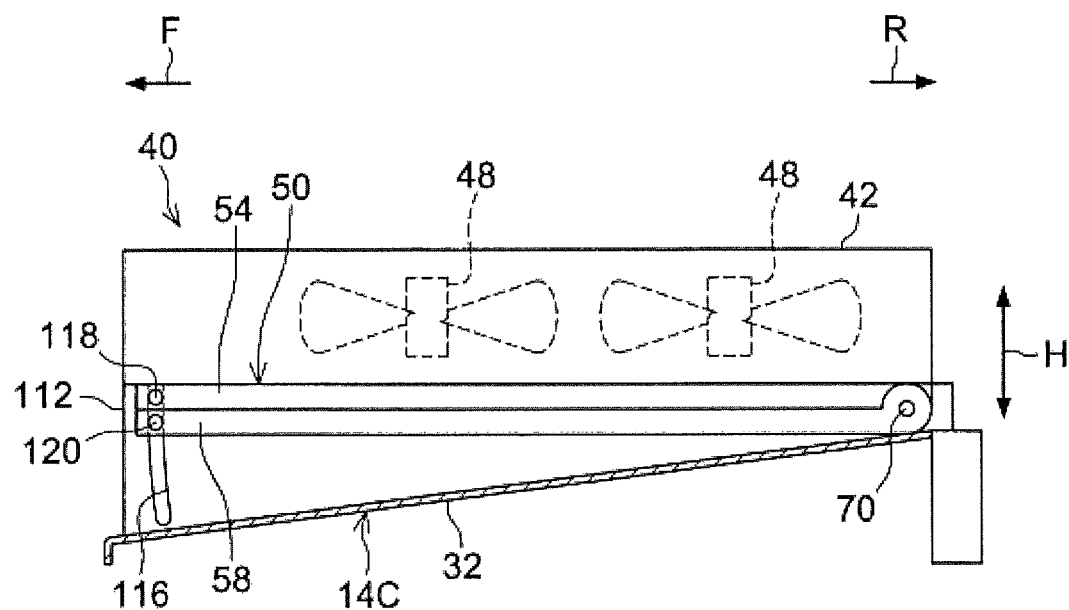
FIG. 13A is a vertical sectional view for describing operation of the fan unit illustrated in FIG. 12.
Figure 13B:
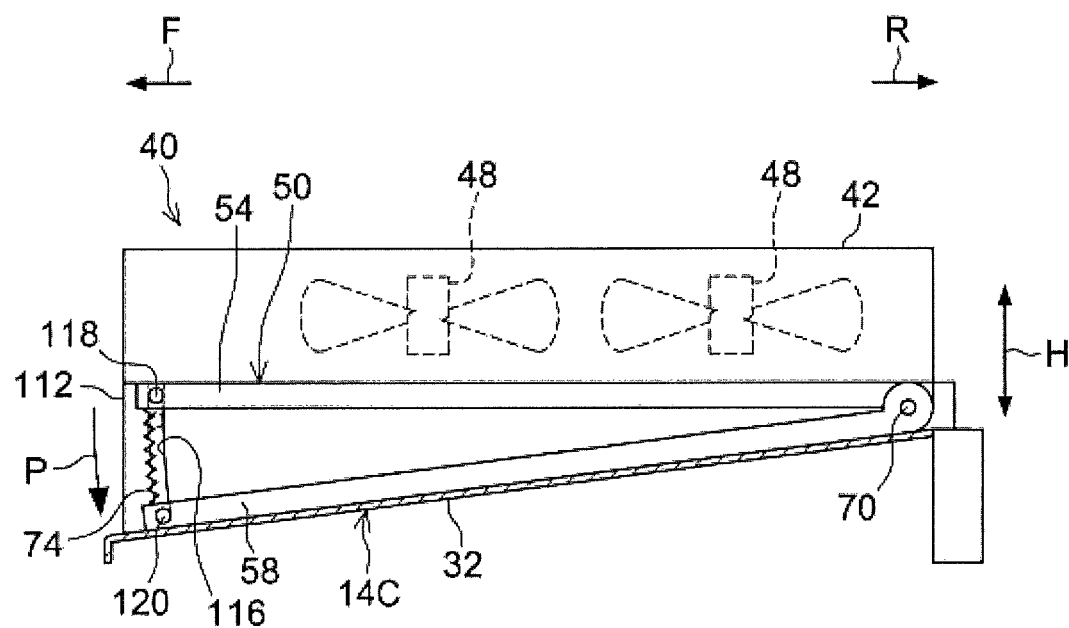
FIG. 13B is a vertical sectional view for describing operation of the fan unit illustrated in FIG. 12.

On the other hand, the guide groove 116 is provided on a front-end side of each of the pair of partition plates 112. Slide pins 118 and 120 are provided on the first frame 54 and the second frame 58, respectively, to be inserted into the guide grooves 116. Further, for example, as illustrated in FIGS. 13A and 13B, the slide pin 120 slides downward along the guide groove 116, when the second frame 58 turns downward about the rotation shaft 70 relative to the first frame 54 (an arrow P).

Guiding the movement of the second frame 58 by using the guide groove 116 in this way allows easy expansion of the front-face auxiliary filter 74 between the first frame 54 and the second frame 58. In addition, guiding the movement of the second frame 58 by using the guide groove 116 allows the front-face auxiliary filter 74 to be housed easily between the first frame 54 and the second frame 58.

Moreover, in the present modification, the partition plates 112 are provided to separate a part of the air-intake duct section 14C from another in the width direction of the housing 14 and therefore, the pair of side-face auxiliary filters 76 (see FIG. 6) may be omitted.

Next, a second embodiment is described. Components similar to those of the first embodiment are provided with the same reference characters as those of the first embodiment, to omit description thereof.

Figure 14:
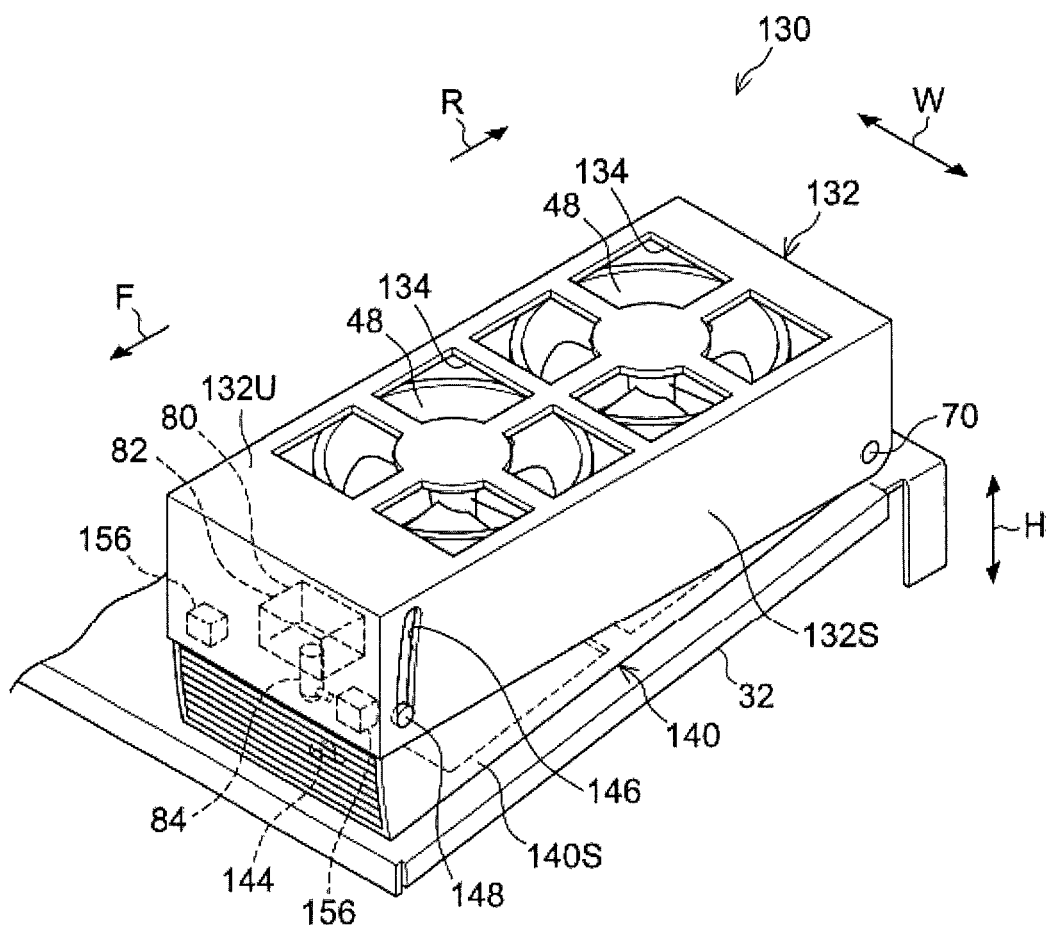
FIG. 14 is a perspective view of a filter unit according to a second embodiment.
Figure 15:
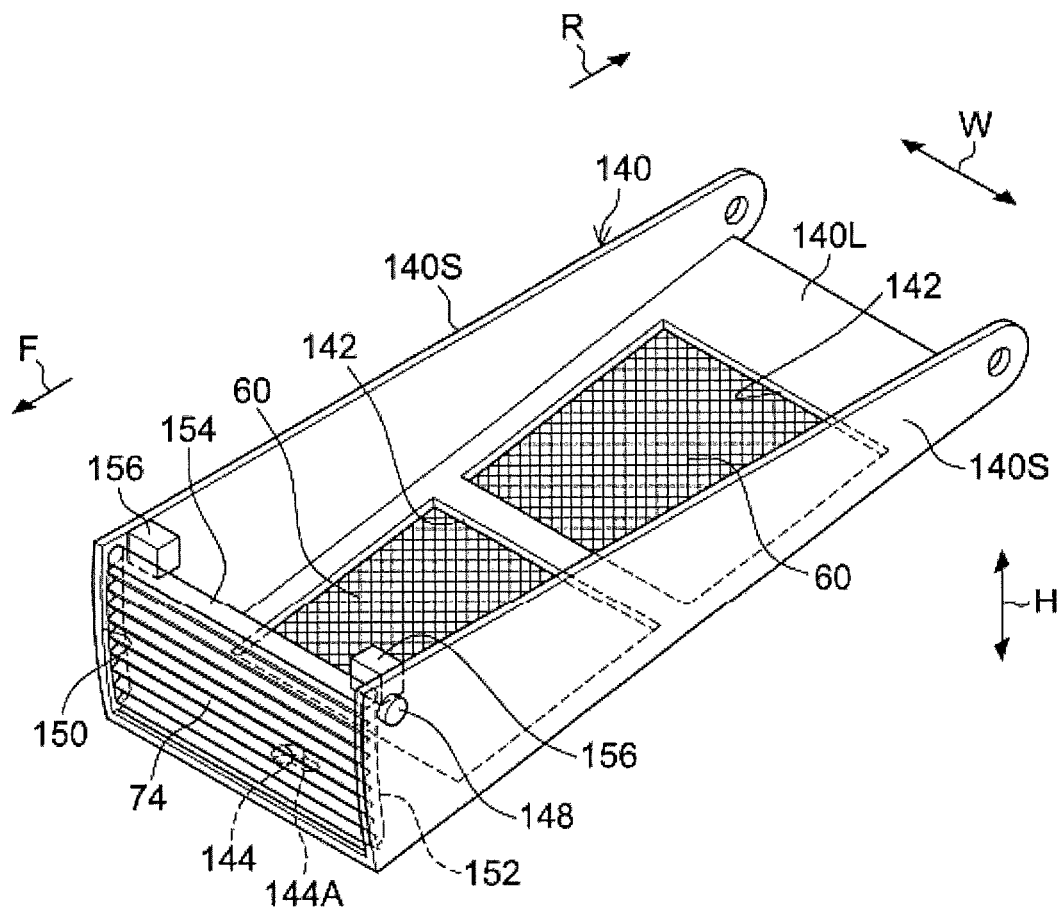
FIG. 15 is a perspective view of an inner case illustrated in FIG. 14.

As illustrated in FIGS. 14 and 15, a filter unit 130 according to the second embodiment includes an outer case 132, a cooling fan 48, an inner case 140, and a holding section 80. The outer case 132 is formed like a box. The cooling fan 48 is housed in the outer case 132.

As illustrated in FIG. 16A, case openings 134 connecting to an air inlet 16 of a heat-generating-body housing section 14A are formed in an upper-wall section 132U of the outer case 132. On the other hand, a case housing port 136 for housing the inner case 140 is formed in the outer case 132, at a position opposite the case openings 134.

The inner case 140 is housed in the outer case 132. As illustrated in FIGS. 15 and 16A, the inner case 140 has a filter housing section 140L forming a bottom-wall portion, and a pair of sidewall sections 140S. In the filter housing section 140L, attachment openings 142 are formed to face the case opening 134. A filter 60 is attached to each of the attachment openings 142. The filter 60 covers the air inlet 16 from below (from outside of the heat-generating-body housing section 14A), to remove dirt and dust in the air that flows from an air-intake duct section 14C to the air inlet 16.

Further, an engagement aperture 144, into which a rotation rod 84 of the holding section 80 is to be inserted, is formed on a front side of the filter housing section 140L. A long groove 144A, into which a holding pin 84A on a tip side of the rotation rod 84 is to be inserted, is formed on an edge of the engagement aperture 144. In the present embodiment, the rotation rod 84 is provided with the one holding pin 86A, as is different from the first embodiment.

As illustrated in FIG. 15, the pair of sidewall sections 140S protrude to extend from the filter housing section 140L to the case housing port 136, and face each other in a width direction of a housing 14, to separate a part of the air-intake duct section 14C from another in the width direction of the housing 14. A guide pin 148 is provided on an outer face of each of the pair of sidewall sections 140S, to be inserted into a guide groove 146 (see FIG. 14) formed on a sidewall 132S of the outer case 132.

An auxiliary air vent 150 connecting to the case opening 134 is formed between front-end parts of the respective sidewall sections 140S of the inner case 140. A front-face auxiliary filter 74 is attached to the pair of sidewall sections 140S. The front-face auxiliary filter 74 shifts from a closed state of covering the auxiliary air vent 150 to an open state of uncovering the auxiliary air vent 150.

Specifically, a guide rail 152 extending in a vertical direction is formed on each of the pair of sidewall sections 140S. A slide rod 154 is to be inserted into the guide rail 152. One end part (an upper end part) of the front-face auxiliary filter 74 is attached to the slide rod 154. The front-face auxiliary filter 74 shifts from the closed state (a state illustrated in FIG. 16B) of covering the auxiliary air vent 150 to the open state (a state illustrated in FIG. 16C) of uncovering the auxiliary air vent 150, by sliding of the slide rod 154 in the vertical direction along the guide rail 152. The other end (a lower end part) of the front-face auxiliary filter 74 is attached to the filter housing section 140L of the inner case 140.

Further, a pair of electromagnets 156 are provided on the pair of sidewall sections 140S, respectively, to hold both end parts of the slide rod 154. Each of the pair of electromagnets 156 generates a magnetic force by receiving electric power, so that both ends of the slide rod 154 adhere thereto. The slide rod 154 is formed of, for example, a magnetic substance such as metal. Furthermore, a control section 160 (see FIG. 16A) is electrically connected to the pair of electromagnets 156. The control section 160 controls application of electric power to the pair of electromagnets 156.

Figure 16B:
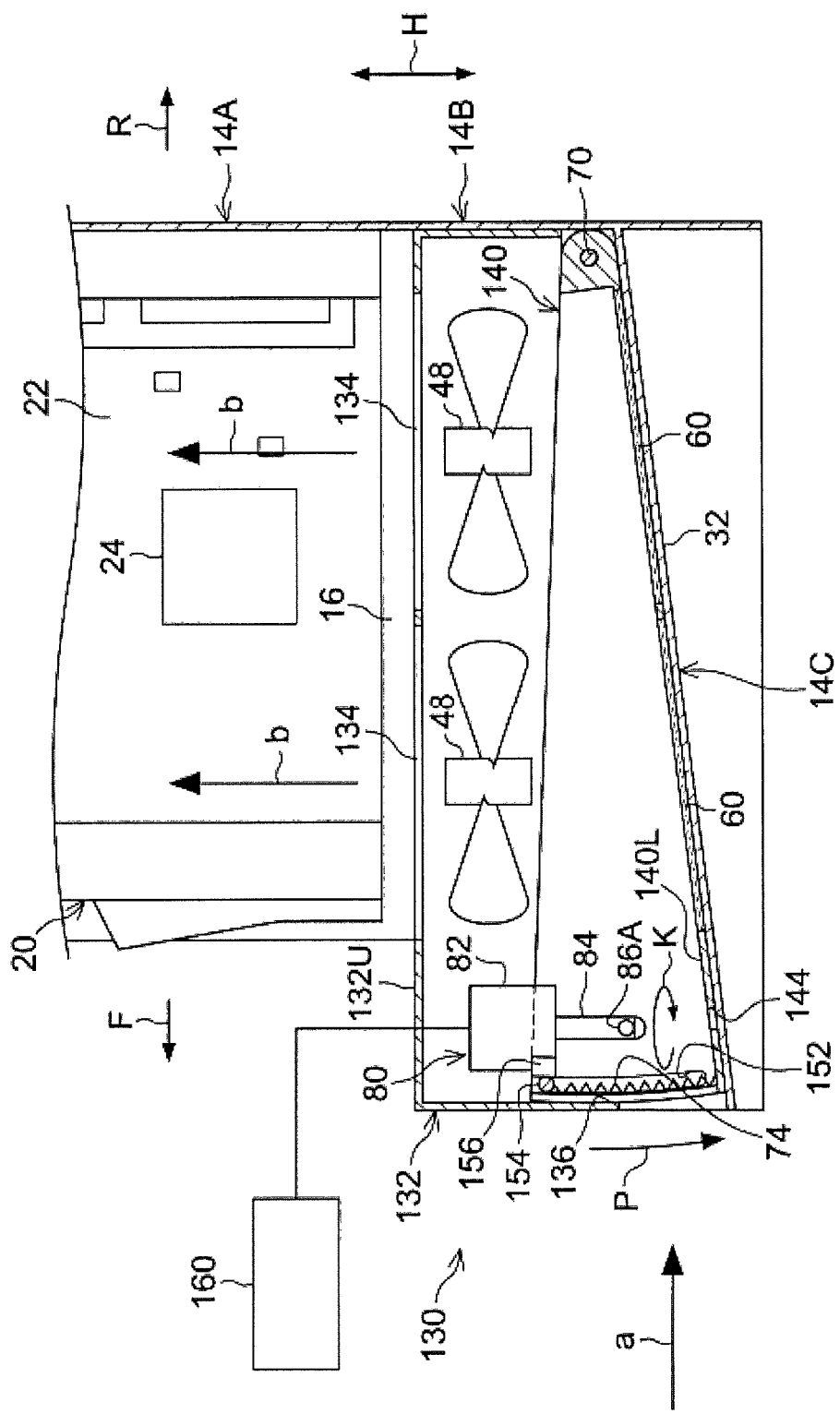
FIG. 16B is a sectional view corresponding to FIG. 5B, for describing operation of the filter unit illustrated in FIG. 14.

As illustrated in FIG. 16A, the inner case 140 is supported by the outer case 132 via a rotation shaft 70 provided on a rear end side. When the inner case 140 turns downward about the rotation shaft 70, the inner case 140 moves outward from the heat-generating-body housing section 14A (toward the air-intake duct section 14C). Therefore, the filter housing section 140L shifts from a closed state (a position illustrated in FIG. 16A) in which the filter 60 covers the air inlet 16, to an open state (a position illustrated in FIGS. 16B and 16C) in which the air inlet 16 is uncovered.

In addition, the front-face auxiliary filter 74 housed in the outer case 132 is exposed, when the inner case 140 turns downward about the rotation shaft 70. In other words, the front-face auxiliary filter 74 expands between the outer case 132 and the filter housing section 140L of the inner case 140, when the inner case 140 turns downward about the rotation shaft 70. Therefore, air is supplied from the air-intake duct section 14C to the air inlet 16, through the auxiliary air vent 150 covered with the front-face auxiliary filter 74.

Next, operation of the control section 160 is described.

An initial state of the filter unit 130 is illustrated in FIG. 16A. In this initial state, the inner case 140 in a state of being housed in the outer case 132 is held by the holding pin 86A of the holding section 80, and the filter 60 is in the closed state of covering the air inlet 16. Further, the slide rod 154 is held by the pair of electromagnets 156 receiving the electric power, and the front-face auxiliary filter 74 is in the closed state of covering the auxiliary air vent 150.

In this state, the control section 160 activates the cooling fan 48 of the filter unit 130, for cooling electronic components 24 in the heat-generating-body housing section 14A. Further, the control section 160 monitors the temperature T of each of the electronic components 24, and controls the filter unit 130 so that a temperature T of each of the electronic components 24 remains below a threshold $T_{MAX}$. Each step to be executed by the control section 160 is described below with reference to FIG. 17.

In step S31, the control section 160 activates the cooling fan 48 of the filter unit 130 at a certain number of revolutions. This causes air (outside air) to be sucked from the outside-air intake opening 30 into the air-intake duct section 14C, as indicated by an arrow "a" in FIG. 16A. The air sucked into the air-intake duct section 14C is then sent from the air inlet 16 to the heat-generating-body housing section 14A, upon passing through the filter unit 130, as indicated by an arrow "b". During this process, the filter 60 removes dirt and dust in the air.

Next, in step S32, the control section 160 acquires the temperature T of the electronic component 24 detected by a temperature sensor 88 (see FIG. 9). Next, in step S33, the control section 160 determines whether the temperature T, which is detected by the temperature sensor 88, of the electronic component 24 exceeds the threshold $T_{MAX}$. When the temperature T of the electronic component 24 is the threshold $T_{MAX}$ or below ($T \leq T_{MAX}$), the control section 160 executes the processing of step S32 again.

On the other hand, when the temperature T of the electronic component 24 exceeds the threshold $T_{MAX}$ ($T > T_{MAX}$), the control section 160 activates the lock motor 82 in step S34, so that the rotation rod 84 rotates for certain amount as indicated by an arrow K in FIG. 16B. When the holding pin 86A of the rotation rod 84 arrives at the long groove 144A (see FIG. 15) formed on the edge of the engagement aperture 144 of the inner case 140 due to the rotation of the rotation rod 84, a state of engagement between the holding pin 86A and the inner case 140 is released.

As a result, the inner case 140 turns downward about the rotation shaft 70 due to self-weight, to be drawn out from the outer case 132. This causes the filter housing section 140L to move toward the air-intake duct section 14C. As a result, the filter housing section 140L shifts from the closed state (the position illustrated in FIG. 16A) in which the filter 60 covers the air inlet 16 to the open state (the position illustrated in FIG. 16B) in which the air inlet 16 is uncovered. In the open state, the filter housing section 140L is positioned along a guide plate 32.

In addition, the front-face auxiliary filter 74 expands between the outer case 132 and the filter housing section 140L of the inner case 140, when the inner case 140 is drawn out from the outer case 132. As a result, air is supplied from the air-intake duct section 14C to the air inlet 16, through the auxiliary air vent 150 covered with the front-face auxiliary filter 74. Therefore, an amount of air taken into the heat-generating-body housing section 14A increases and therefore, a reduction in efficiency of cooling the electronic component 24 is suppressed.

Furthermore, the front-face auxiliary filter 74 removes dirt and dust in the air to be supplied from the air-intake duct section 14C to the air inlet 16. Therefore, trouble such as a malfunction of the electronic component 24 is suppressed.

Next, in step S35, the control section 160 causes alarm information to be transmitted to a monitoring terminal 110 (see FIG. 10). This causes, for example, a monitor of the monitoring terminal 110 to display a message or the like indicating that the front-face auxiliary filter 74 is expanded.

Next, in step S36, the control section 160 acquires the temperature T, which is detected by the temperature sensor 88, of the electronic component 24 (see FIG. 9).

Next, in step S37, the control section 160 determines whether the temperature T, which is detected by the temperature sensor 88, of the electronic component 24 exceeds the threshold $T_{MAX}$. When the temperature T of the electronic component 24 is the threshold $T_{MAX}$ or below ($T \leq T_{MAX}$), the control section 160 executes processing of step S36 again.

Figure 16C:
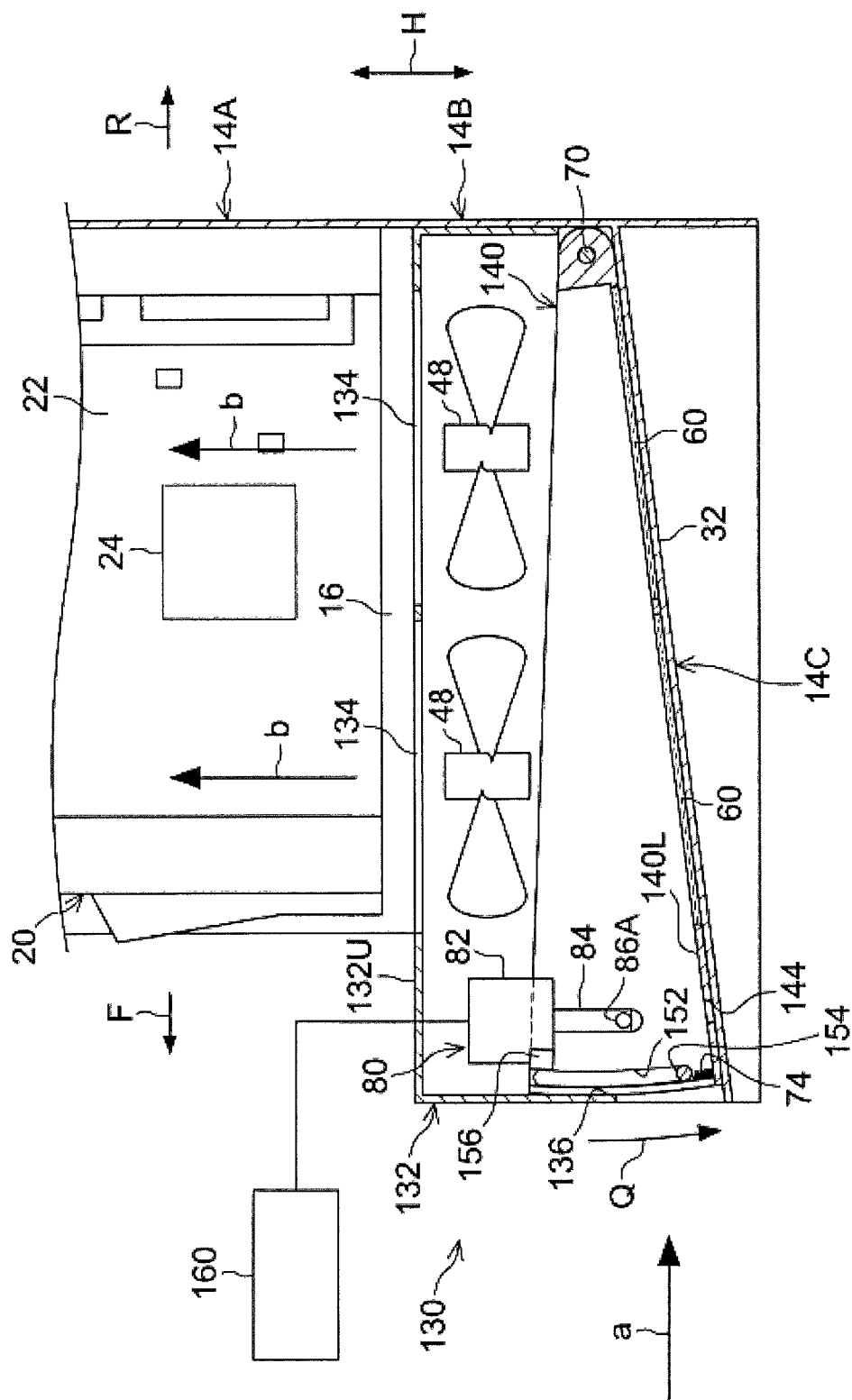
FIG. 16C is a sectional view corresponding to FIG. 5C, for describing operation of the filter unit illustrated in FIG. 14.

On the other hand, when the temperature T of the electronic component 24 exceeds the threshold $T_{MAX}$ ($T > T_{MAX}$), the control section 160 stops application of electric power to the pair of electromagnets 156 in step S38. This causes the slide rod 154 to slide downward along the guide rail 152, so that the front-face auxiliary filter 74 shifts from the closed state of covering the auxiliary air vent 150 to the open state of uncovering the auxiliary air vent 150, as illustrated in FIG. 16C. As a result, an amount of air supplied from the auxiliary air vent 150 to the air inlet 16 increases, which suppresses a reduction in the efficiency of cooling the electronic component 24.

Next, in step S39, the control section 160 causes alarm information to be transmitted to the monitoring terminal 110. This causes, for example, the monitor of the monitoring terminal 110 to display a message or the like indicating that the auxiliary air vent 150 is uncovered.

Step S2 to step S5 (see FIG. 11) described above may be added between step S31 and step S32.

Next, effects of the second embodiment are described.

As described above, according to the present embodiment, the air inlet 16 is uncovered by drawing out the inner case 140, to which the filter 60 is attached, from the outer case 132 in the thickness direction of the filter housing section 140L. Therefore, forming a space next to the air inlet 16 to accommodate the filter 60 may be avoided, which allows the housing 14 to be reduced in size in a front-back direction, as with the first embodiment. Further, in the present embodiment, a size reduction of the heat-generating-body housing section 14A in the height direction is achievable, as compared with a configuration of laterally sliding the filter 60 relative to the air inlet 16.

In addition, the inner case 140 and the filter 60 move outward from the heat-generating-body housing section 14A (toward the air-intake duct section 14C) relative to the air inlet 16. Therefore, a space for accommodating the filter 60 in the heat-generating-body housing section 14A may be avoided, which allows a size reduction of the heat-generating-body housing section 14A in the height direction.

Moreover, in the present embodiment, the inner case 140 and the filter 60 are allowed to move in the thickness direction of the filter housing section 140L relative to the outer case 132, due to self-weight. Therefore, a movement mechanism of the filter 60 may be simplified.

Further, the filter housing section 140L is disposed along the guide plate 32 in the open state. Therefore, an adverse effect on the flow of the air in the air-intake duct section 14C is small, even if the filter housing section 140L is shifted from the closed state to the open state.

Besides, the front-face auxiliary filter 74 expands between the outer case 132 and the filter housing section 140L of the inner case 140, when the inner case 140 moves in the thickness direction of the filter housing section 140L relative to the outer case 132. The front-face auxiliary filter 74 removes dirt, dust, and the like in the air to be supplied from the air-intake duct section 14C to the air inlet 16. Therefore, trouble such as a malfunction of the electronic component 24 may be suppressed.

Furthermore, when the application of the electric power to the pair of electromagnets 156 is stopped, the slide rod 154, to which the upper end part of the front-face auxiliary filter 74 is attached, slides toward the air-intake duct section 14C along the guide rail 152 due to self-weight. This causes the front-face auxiliary filter 74 to shift from the closed state of covering the auxiliary air vent 150 to the open state of uncovering the auxiliary air vent 150. Therefore, a reduction in the efficiency of cooling the electronic component 24 may be suppressed even if the front-face auxiliary filter 74 is clogged.

Moreover, the inner case 140 includes the pair of sidewall sections 140S that separate a part of the air-intake duct section 14C from another in the width direction of the housing 14. Therefore, in the present embodiment, the side-face auxiliary filters 76 (see FIG. 6) in the first embodiment may be omitted.

Next, a third embodiment is described. Components similar to those of the first and second embodiments are provided with the same reference characters as those of the first and second embodiments, to omit description thereof.

Figure 18:
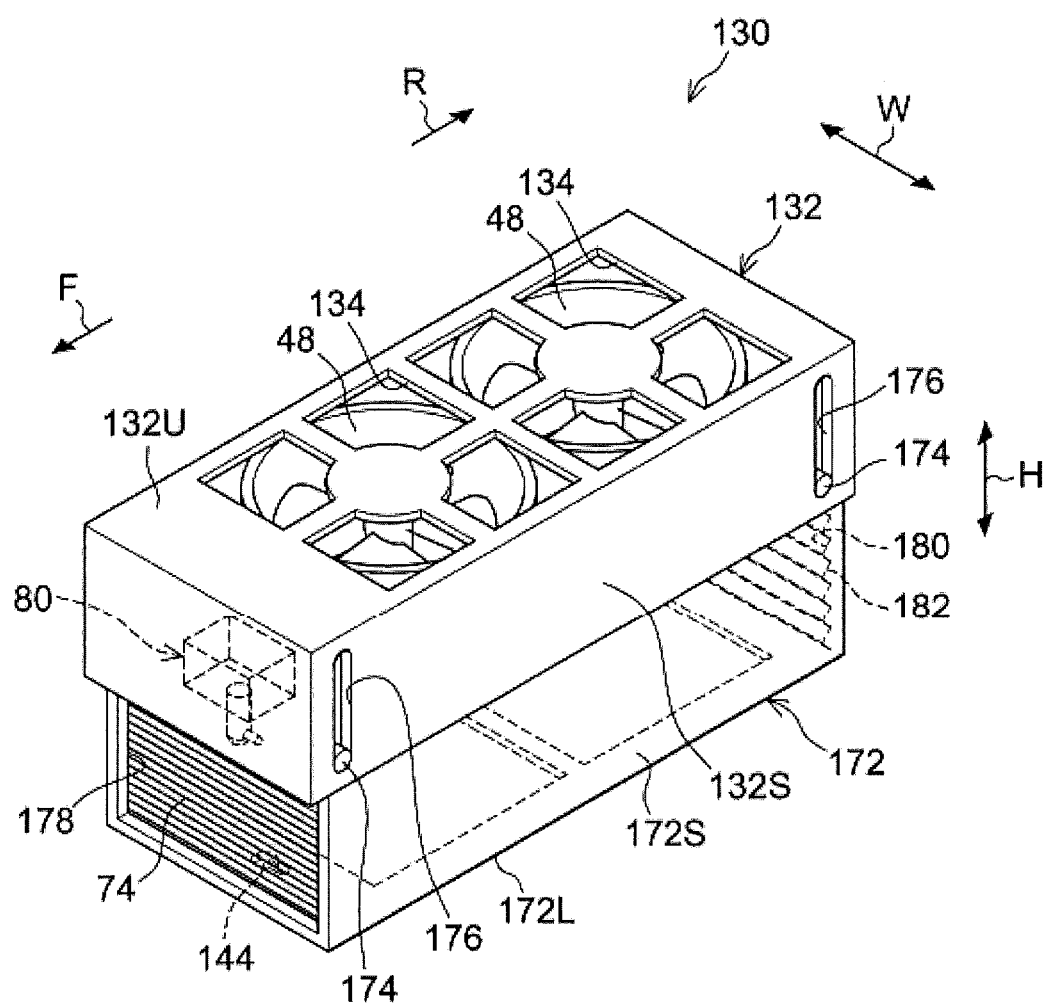
FIG. 18 is a perspective view of a filter unit according to a third embodiment.

As illustrated in FIG. 18, in a filter unit 170 according to the third embodiment, an inner case 172 is drawn out from an outer case 132, by sliding in a thickness direction (a direction indicated by an arrow H) of a filter housing section 172L. This causes the filter housing section 172L to move toward an air-intake duct section 14C. As a result, the filter housing section 172L shifts from a closed state (a position illustrated in FIG. 19A) in which a filter 60 covers an air inlet 16 to an open state (a position illustrated in FIGS. 19B and 19C) in which the air inlet 16 is uncovered.

Specifically, the inner case 172 includes the filter housing section 172L forming a bottom-wall portion, and a pair of sidewalls 172S extending from the filter housing section 172L to a case housing port 136 and facing each other in a width direction of a housing 14. A slide pin 174 is provided at each of a front-end part and a rear end part of each of the pair of sidewalls 172S. The slide pin 174 is an example of a slide member.

On the other hand, a guide groove 176 extending in a vertical direction is formed at each of a front-end part and a rear end part of each of sidewalls 132S of the outer case 132. The slide pin 174 is inserted into each of the guide grooves 176. The inner case 172 is drawn out in the thickness direction of the filter housing section 172L relative to the outer case 132, when the slide pin 174 slides downward along the guide groove 176.

Further, auxiliary air vents 178 and 180 are formed between front end parts of the respective sidewalls 172S and between rear end parts of the respective sidewalls 172S, respectively, in the inner case 172. Furthermore, a front-face auxiliary filter 74 and a rear-face auxiliary filter 182 are attached to the inner case 172, to cover the auxiliary air vents 178 and 180, respectively. The front-face auxiliary filter 74 and the rear-face auxiliary filter 182 are each formed like a mesh as well as being formed like bellows. The front-face auxiliary filter 74 and the rear-face auxiliary filter 182 are configured to shift from a closed state (a state illustrated in FIG. 19B) of covering the auxiliary air vents 178 and 180 to an open state (a state illustrated in FIG. 19C) of uncovering the auxiliary air vents 178 and 180, as with the above-described second embodiment.

Figure 19A:
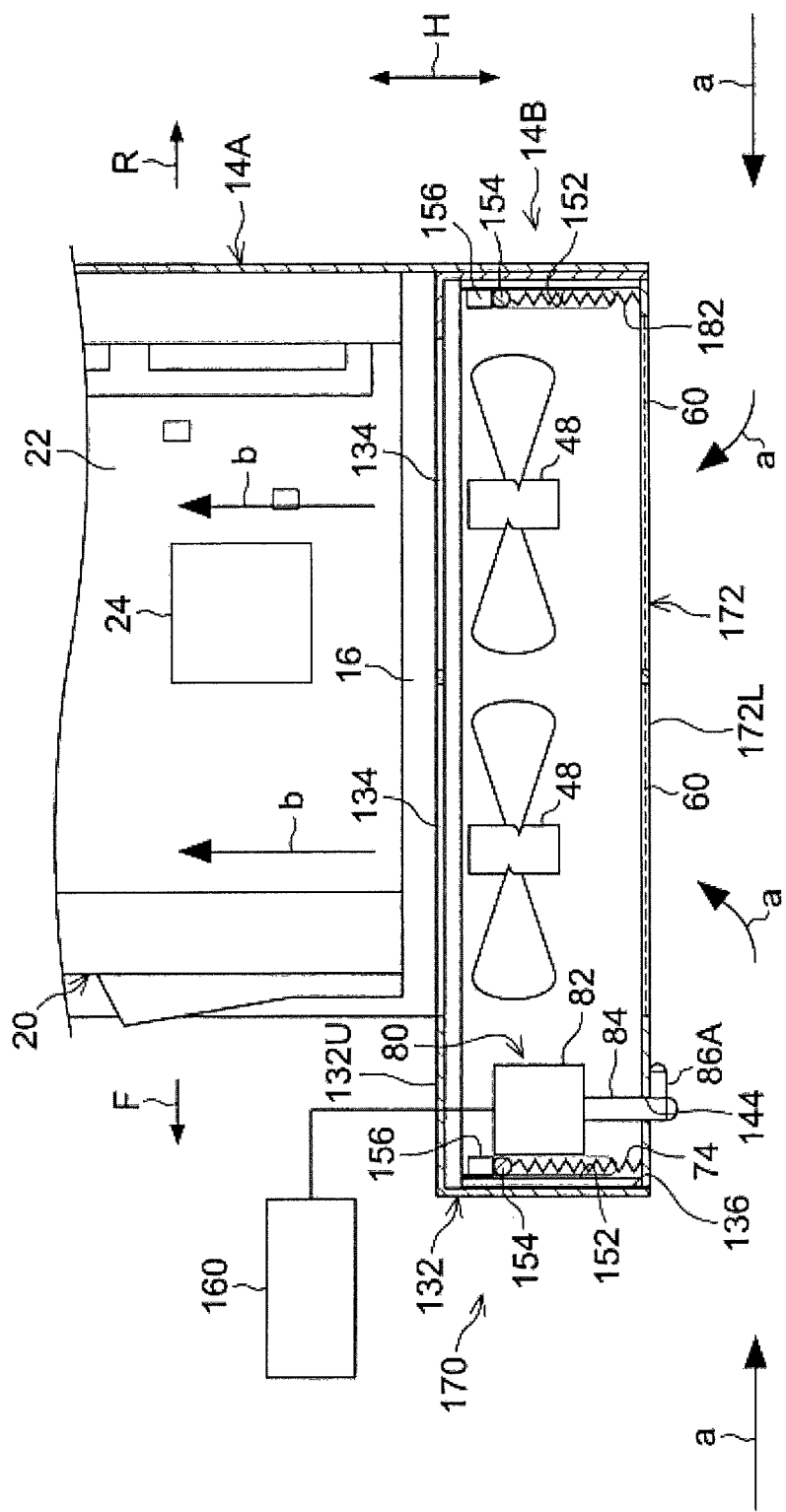
FIG. 19A is a sectional view corresponding to FIG. 5A, for describing operation of the filter unit illustrated in FIG. 18.
Figure 19B:
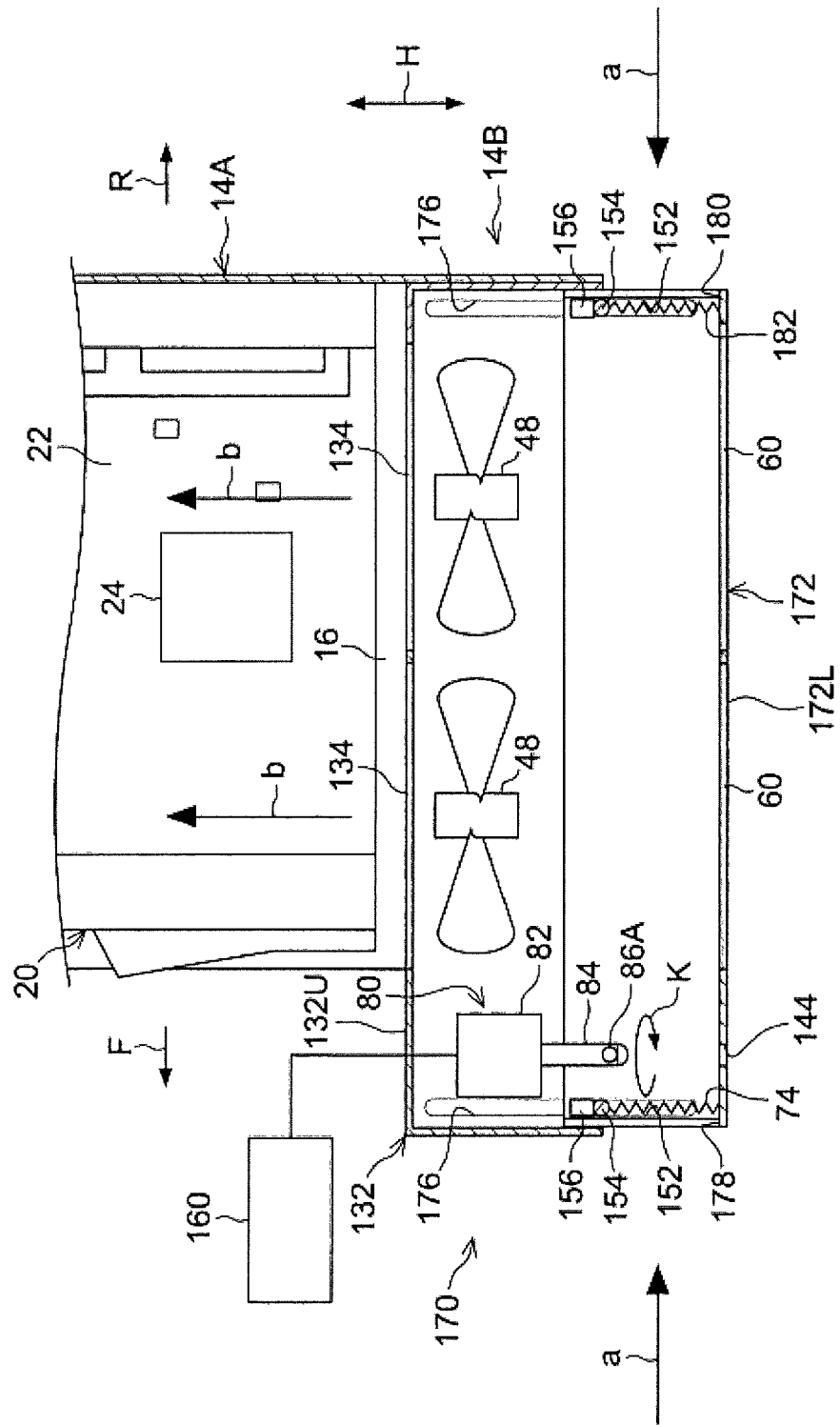
FIG. 19B is a sectional view corresponding to FIG. 5B, for describing operation of the filter unit illustrated in FIG. 18.

Here, FIG. 19A illustrates an initial state of the filter unit 170. In this state, for example, when a control section 160 activates a lock motor 82 so that a rotation rod 84 rotates for a certain amount as indicated by an arrow K in FIG. 19B, a state of engagement between a holding pin 86A and the inner case 172 is released.

This causes the slide pin 174 of the inner case 172 to slide downward along the guide groove 176 due to self-weight, so that the inner case 172 is drawn out downward from the outer case 132. In other words, the inner case 172 moves outward from a heat-generating-body housing section 14A (toward the air-intake duct section 14C) in the thickness direction of the filter housing section 172L. As a result, the filter housing section 172L shifts from the closed state (the position illustrated in FIG. 19A) in which the filter 60 covers the air inlet 16 to the open state (the position illustrated in FIGS. 19B and 19C) in which the air inlet 16 is uncovered.

In addition, the front-face auxiliary filter 74 and the rear-face auxiliary filter 182 are exposed, when the inner case 172 is drawn out from the outer case 132. In other words, when the inner case 172 is drawn out from the outer case 132, the front-face auxiliary filter 74 and the rear-face auxiliary filter 182 expand between the outer case 132 and the filter housing section 172L of the inner case 172. Therefore, from an outside-air intake opening (not illustrated) formed on each of a front-face side and a rear-face side of the housing 14, air is supplied to the air inlet 16, through the auxiliary air vents 178 and 180 covered with the front-face auxiliary filter 74 and the rear-face auxiliary filter 182, respectively. Accordingly, a reduction in efficiency of cooling an electronic component 24 is suppressed.

Further, the front-face auxiliary filter 74 and the rear-face auxiliary filter 182 remove dirt and dust in the air to be supplied from the auxiliary air vents 178 and 180 to the air inlet 16. Therefore, trouble such as a malfunction of the electronic component 24 is suppressed.

Furthermore, as illustrated in FIG. 19C, a slide rod 154 slides downward along a guide rail 152, when the control section 160 stops application of electric power to a pair of electromagnets 156. This causes the front-face auxiliary filter 74 and the rear-face auxiliary filter 182 to shift from the closed state (the state illustrated in FIG. 19B) of covering the auxiliary air vents 178 and 180 to the open state (the state illustrated in FIG. 19C) of uncovering the auxiliary air vents 178 and 180. As a result, an amount of air supplied from the auxiliary air vents 178 and 180 to the air inlet 16 increases, which suppresses a reduction in the efficiency of cooling the electronic component 24.

Next, effects of the third embodiment are described.

According to the present embodiment, the air inlet 16 is uncovered by drawing out the inner case 172, to which the filter 60 is attached, from the outer case 132 in the thickness direction of the filter housing section 172L. Therefore, forming a space next to the air inlet 16 to accommodate the filter 60 may be avoided, which allows the housing 14 to be reduced in size in a front-back direction, as with the first and second embodiments. Further, in the present embodiment, a size reduction of the heat-generating-body housing section 14A in a height direction is achievable, as compared with a configuration of laterally sliding the filter 60 relative to the air inlet 16.

In addition, the inner case 172 and the filter 60 move outward from the heat-generating-body housing section 14A (toward the air-intake duct section 14C) relative to the air inlet 16. Therefore, a space for accommodating the filter 60 in the heat-generating-body housing section 14A may be avoided, which allows a size reduction of the heat-generating-body housing section 14A in the height direction.

Moreover, in the present embodiment, the inner case 172 and the filter 60 are allowed to move in the thickness direction of the filter housing section 172L relative to the outer case 132, due to self-weight. Therefore, a movement mechanism of the filter 60 may be simplified.

Furthermore, in the present embodiment, the air may be supplied to the air inlet 16 from the auxiliary air vents 178 and 180 on the front side and the rear side of the inner case 172.

Next, modifications of the first to third embodiments are described. Various modifications are described below by using the first embodiment as an example, but may be applicable to the second and third embodiments as appropriate.

Figure 20:
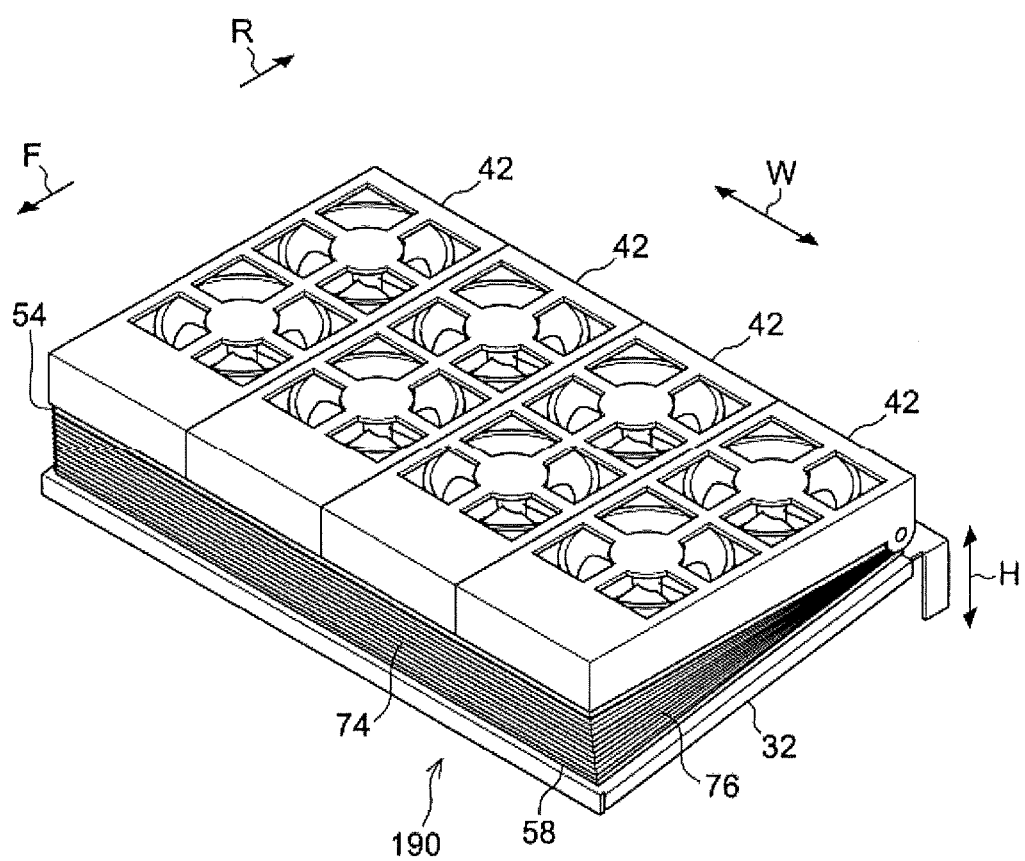
FIG. 20 is a perspective view corresponding to FIG. 6, of a modification of the filter unit in the first embodiment.

In the above-described first embodiment, providing the filter unit 50 for each of the fan cases 42 is taken as an example, as illustrated in FIG. 6. However, as illustrated in FIG. 20, one filter unit 190 may be provided for plural fan cases 42.

Figure 21A:
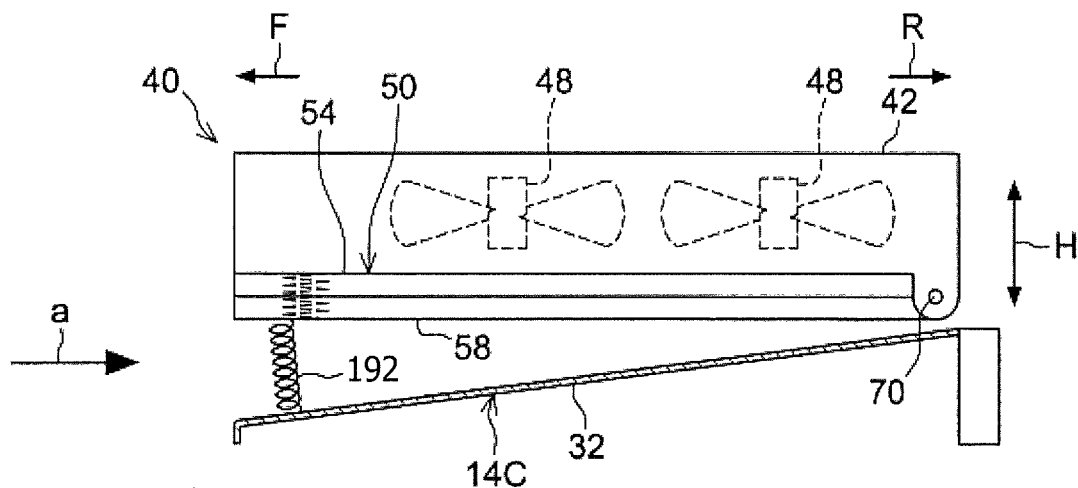
FIG. 21A is a sectional view corresponding to FIG. 5A, of a modification of the filter unit in the first embodiment.
Figure 21B:
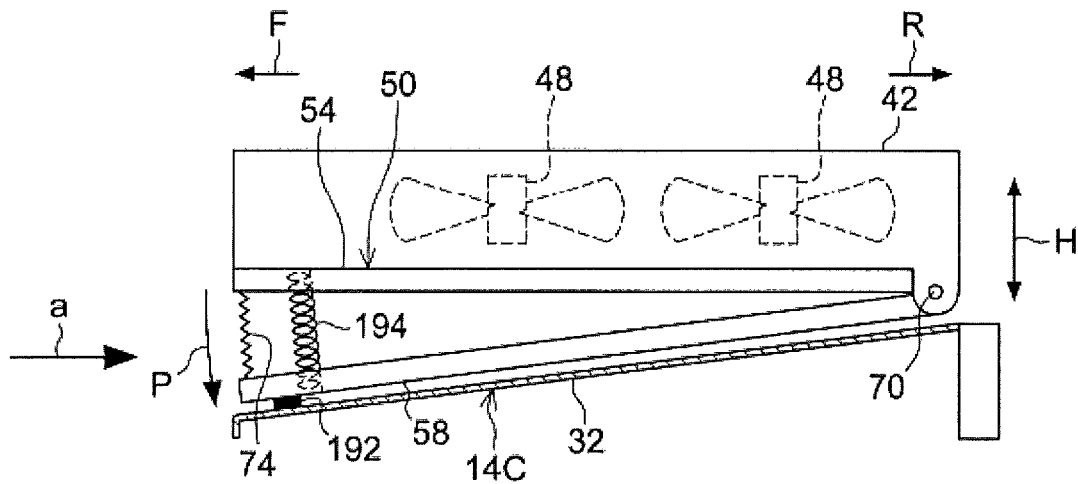
FIG. 21B is a sectional view corresponding to FIG. 5B, of the modification of the filter unit in the first embodiment.

Further, in the above-described first embodiment, allowing the second frame 58 to turn downward relative to the first frame 54 due to self-weight is taken as an example, but the way of moving the second frame 58 relative to the first frame 54 may be modified as appropriate. For example, as illustrated in FIGS. 21A and 21B, the second frame 58 may be turned downward relative to the first frame 54, by using elasticity (tension) of a first elastic body 192 connecting the second frame 58 and the guide plate 32.

Figure 21C:
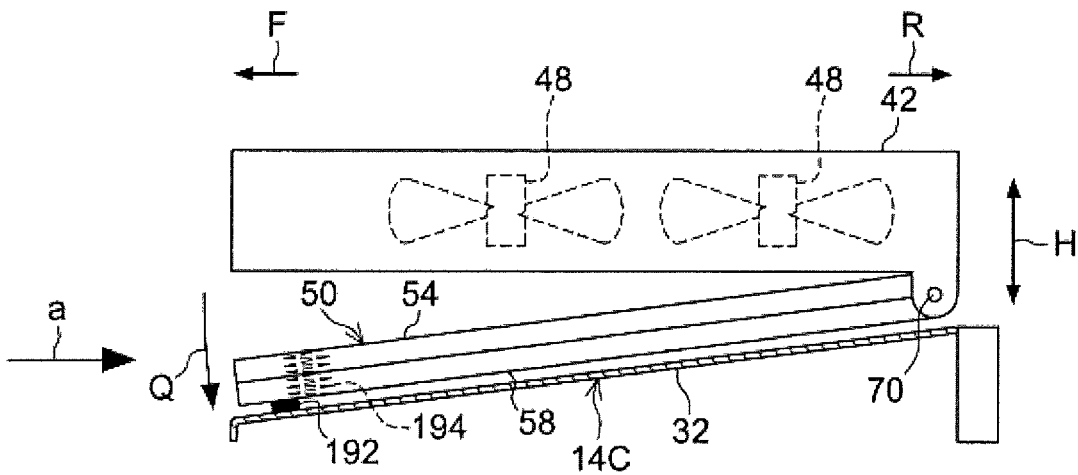
FIG. 21C is a sectional view corresponding to FIG. 5C, of the modification of the filter unit in the first embodiment.

Similarly, as illustrated in FIG. 21C, the first frame 54 may be turned downward relative to the fan case 42, by using elasticity (tension) of a second elastic body 194 connecting the first frame 54 and the second frame 58. This allows the first frame 54 and the second frame 58 to turn reliably. The first elastic body 192 and the second elastic body 194 are each formed of, for example, a coil spring.

The thickness direction of the filter housing section 58L in the above-described first embodiment may be regarded as, for example, a direction intersecting a surface of the filter 60, an opening direction of the air inlet 16, or an inflow direction of air toward the air inlet 16.

Further, the holding section 80 may be modified as appropriate in terms of structure, as long as the holding section 80 is allowed to hold the first frame 54 and the second frame 58 in the closed state. In addition, the first frame 54 and the second frame 58 may be turned by, for example, a motor or the like.

Moreover, the second frame 58 may be caused to fall upon being separated from the first frame 54. Similarly, the first frame 54 may be caused to fall upon being separated from the fan case 42.

Further, in the above-described first embodiment, stacking two frames, namely, the first frame 54 and the second frame 58, is taken as an example, but the number of stacked frames may be modified as appropriate. For example, three or more frames may be stacked and an auxiliary filter may be housed between the adjacent frames.

Figure 22A:
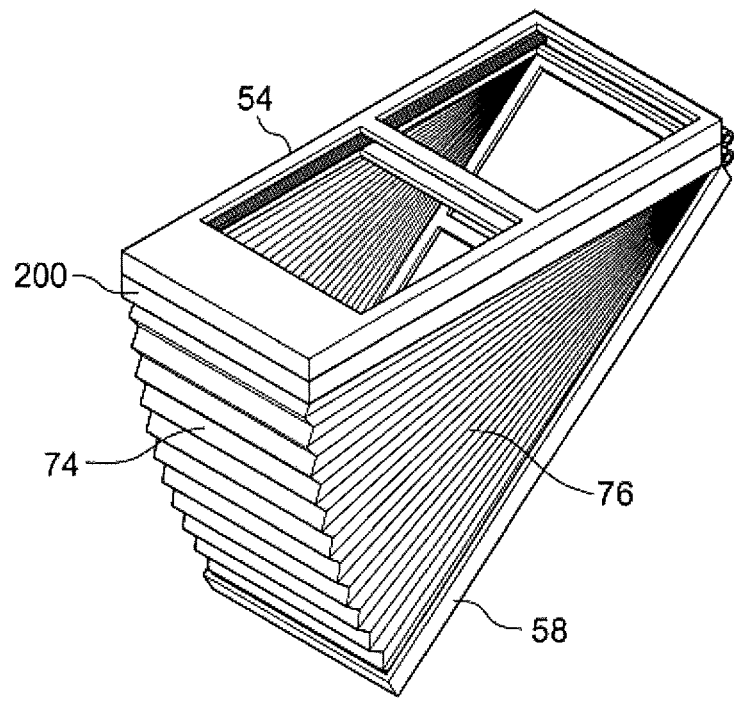
FIG. 22A is a perspective view of a modification of the filter unit in the first embodiment.
Figure 22B:
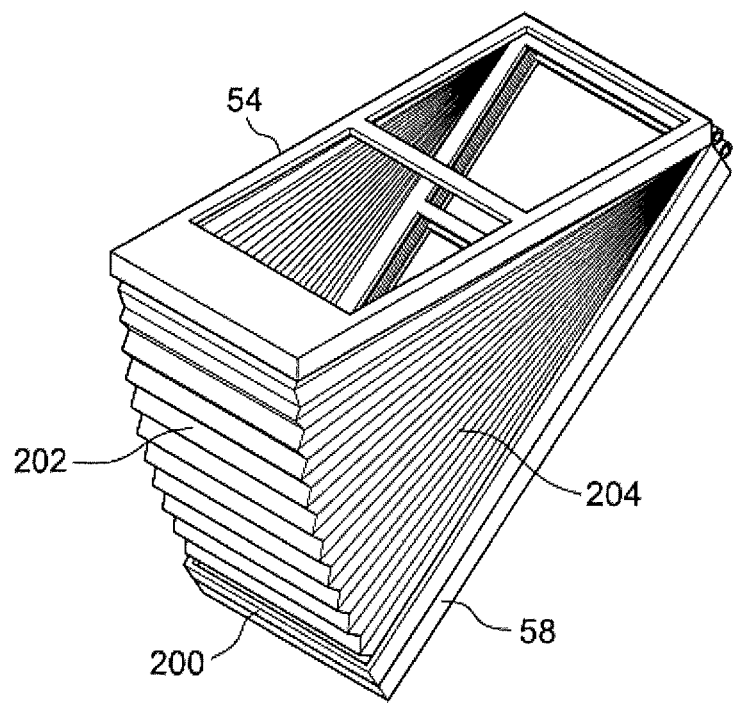
FIG. 22B is a perspective view of a modification of the filter unit in the first embodiment.

For example, as illustrated in FIG. 22A, a third frame 200 may be provided between the first frame 54 and the second frame 58 in the first embodiment. In this case, the front-face auxiliary filter 74 and the side-face auxiliary filters 76 are housed between the third frame 200 and the second frame 58. When the second frame 58 turns downward relative to the third frame 200, the front-face auxiliary filter 74 and the side-face auxiliary filters 76 expand between the third frame 200 and the second frame 58. Further, as illustrated in FIG. 22B, a front-face auxiliary filter 202 and side-face auxiliary filters 204 are housed between the third frame 200 and the first frame 54. When the third frame 200 turns downward relative to the first frame 54, the front-face auxiliary filter 202 and the side-face auxiliary filters 204 expand between the first frame 54 and the third frame 200. The first frame 54, the second frame 58, and the third frame 200 in this operation are controlled as follows.

Figure 11:
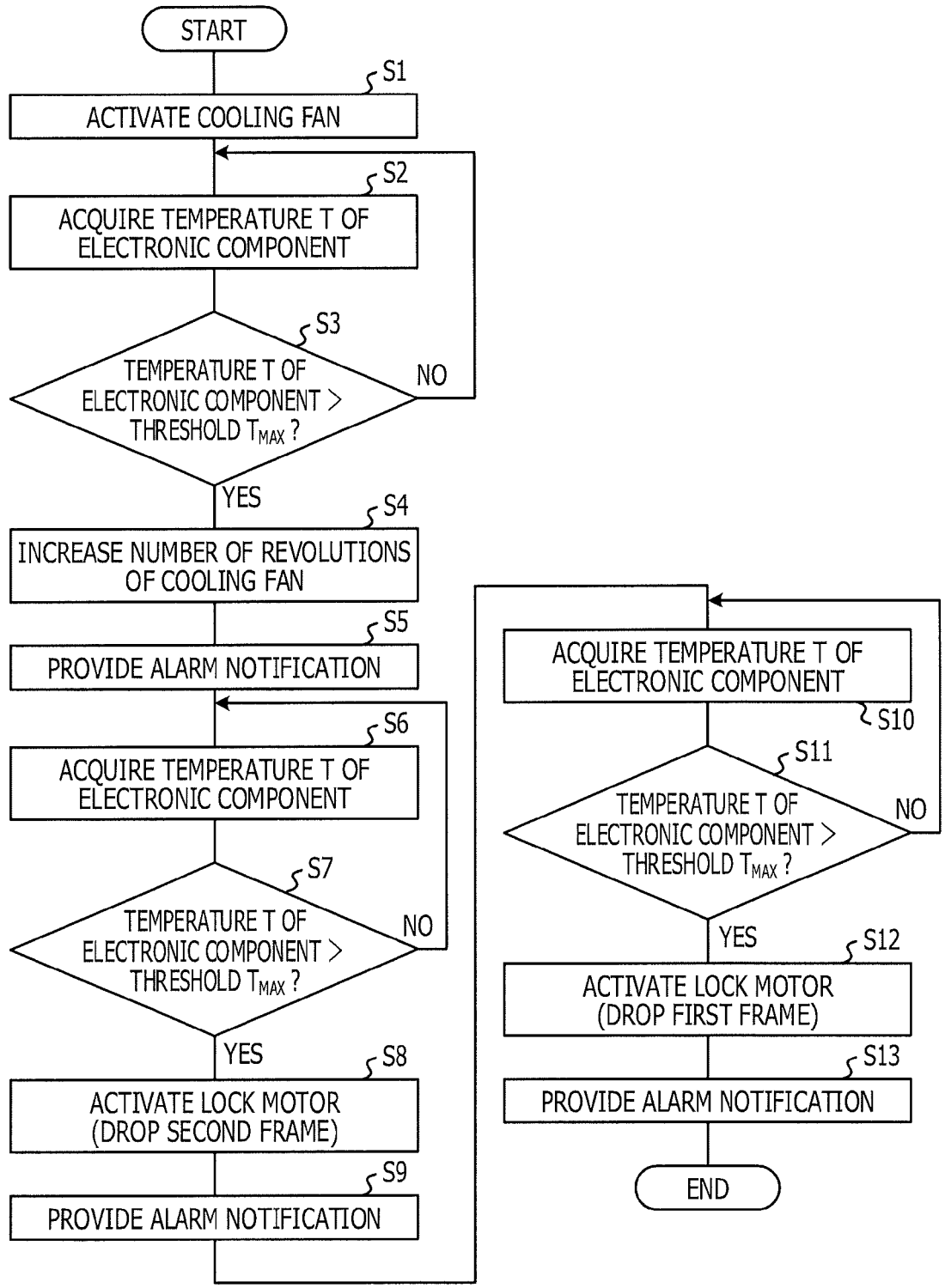
FIG. 11 is a flowchart illustrating a processing flow of the control section illustrated in FIG. 9.

For example, in FIG. 11, the following step is added between step S10 and step S11 that follow falling of the second frame 58. In other words, the control section 90 determines whether the temperature T of the electronic component 24 exceeds the threshold $T_{MAX}$. When the temperature T of the electronic component 24 exceeds the threshold $T_{MAX}$, the control section 90 causes the third frame 200 to fall relative to the first frame 54, so that the front-face auxiliary filter 202 and the side-face auxiliary filters 204 expand between the third frame 200 and the first frame 54. Afterwards, when the temperature T of the electronic component 24 exceeds the threshold $T_{MAX}$ in step S11, the control section 90 causes the first frame 54 to fall. Multiple expandable front-face auxiliary filters and multiple pairs of expandable side-face auxiliary filters may be thus provided, as exemplified by the front-face auxiliary filters 74 and 202 as well as the side-face auxiliary filters 76 and 204.

Further, in the above-described first embodiment, the first frame 54 may be omitted and the second frame 58 may be attached to the fan case 42. In other words, one frame to which the filter 60 is attached may be attached to the fan case 42. In this case, for example, the front-face auxiliary filter 74 and the pair of side-face auxiliary filters 76 are housed between the fan case 42 and the frame to which the filter 60 is attached.

Furthermore, in the above-described first embodiment, housing the front-face auxiliary filter 74 and the pair of side-face auxiliary filters 76 between the first frame 54 and the second frame 58 is taken as an example, but the front-face auxiliary filter 74 and the pair of side-face auxiliary filters 76 may be omitted as appropriate.

In addition, in the above-described first embodiment, attaching the filter unit 50 to the fan case 42 is taken as an example, but the fan case 42 and the filter unit 50 may be separately attached to the housing 14.

Moreover, in the above-described first embodiment, covering the air inlet 16 with the filter 60 from the outside of the heat-generating-body housing section 14A is taken as an example, but the air inlet 16 may be covered with the filter 60 from inside of the heat-generating-body housing section 14A. In this case, for example, the filter 60 moves in the thickness direction of the filter housing section 58L, toward the inside of the heat-generating-body housing section 14A, relative to the air inlet 16.

Further, in the above-described first embodiment, providing the thickness direction of the filter housing section 58L as the height direction (the vertical direction) of the housing 14 is taken as an example, but the thickness direction of the filter housing section 58L may be the front-back direction or the width direction of the housing 14. Furthermore, the thickness direction of the filter housing section 58L may be a direction inclined relative to the height direction of the housing 14.

Further, in the above-described first embodiment, allowing the control section 90 to control the holding section 80 and the like based on the temperature T of the electronic component 24 is taken as an example, but the control section 90 may control the holding section 80 based on a temperature in the heat-generating-body housing section 14A (the housing 14). Furthermore, for example, a flow sensor may be provided in the heat-generating-body housing section 14A, and the control section 90 may control the holding section 80 based on a quantity of flow, which is detected by the flow sensor, in the heat-generating-body housing section 14A.

Moreover, in the above-described first embodiment, providing the cooling fan 48 in the housing 14 is taken as an example, but the cooling fan 48 may be omitted as appropriate.

The embodiments of techniques disclosed by the present application have been described above, but the techniques disclosed by the present application are not limited to the above-described embodiments. In addition, the above-described embodiments and various modifications may be combined as appropriate to be used, and may be of course implemented in various modes, within the scope not departing from the gist of the techniques disclosed by the present application.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. An electronic apparatus comprising:
    a housing that includes an air inlet, and an air-intake duct section provided to supply air to the air inlet; and
    a filter housing that houses a first filter, provided to cover the air inlet, and a second filter,
    wherein the filter housing moves toward the air-intake duct section in an orthogonal direction to a surface of the air inlet in such a manner that a state of the filter housing shifts from a closed state in which the first filter covers the air inlet to an open state in which the air inlet is uncovered,
    wherein the second filter is housed in a folded state when the filter housing is in the closed state and is expanded between the air inlet and the air-intake duct section when the filter housing is in the open state.

2. The electronic apparatus according to claim 1, wherein the housing further includes a heat-generating-body housing section in which the air inlet is formed and which houses a heat generating body, and wherein the filter housing moves outward from the heat-generating-body housing section relative to the air inlet, to shift to the open state.

3. The electronic apparatus according to claim 2, wherein the orthogonal direction is a height direction of the housing, and wherein the filter housing covers the air inlet from below in the closed state.

4. The electronic apparatus according to claim 3, further comprising:
a holding section that holds the filter housing in the closed state, wherein the filter housing moves in the orthogonal direction due to self-weight, upon release of holding of the filter housing by the holding section.

5. The electronic apparatus according to claim 4, further comprising:
a temperature detection section configured to detect a temperature of the heat generating body or a temperature in the heat-generating-body housing section; and
a control section configured to release holding of the filter housing by the holding section, based on the temperature detected by the temperature detection section.

6. The electronic apparatus according to claim 1, wherein the second filter expands
between the air inlet and the filter housing, as the filter housing moves in the orthogonal direction.

7. The electronic apparatus according to claim 6, further comprising:
a first frame that has a frame opening connecting to the air inlet; and
a second frame that includes the filter housing, and moves in the orthogonal direction, wherein the second filter is housed between the first frame and the second frame, and expands between the first frame and the second frame as the second frame moves in the orthogonal direction.

8. The electronic apparatus according to claim 7, wherein the second filter that has expanded between the first frame and the second frame is housed between the first frame and the second frame as the first frame moves toward the second frame.

9. The electronic apparatus according to claim 7, wherein the second frame is supported by the first frame via a rotation shaft, to turn in the orthogonal direction.

10. The electronic apparatus according to claim 6, further comprising:
an outer case that includes a case opening connecting to the air inlet, and a case housing port provided opposite the case opening; and
an inner case that includes the filter housing, and a sidewall section extending from the filter housing to the case housing port, the inner case being housed in the outer case and configured to be drawn out from the case housing port by moving in the orthogonal direction, wherein the second filter is attached to the sidewall section, and expands between the outer case and the filter housing, as the inner case moves in the orthogonal direction.

11. The electronic apparatus according to claim 10, wherein the sidewall section has an auxiliary air vent connecting to the case opening, and wherein the second filter shifts from a closed state of covering the auxiliary air vent to an open state of uncovering the auxiliary air vent.

12. The electronic apparatus according to claim 10, wherein the inner case is attached to the outer case via a rotation shaft, to turn in the orthogonal direction.

13. The electronic apparatus according to claim 10, wherein the inner case is attached to the outer case via a slide member, to slide in the orthogonal direction.

14. The electronic apparatus according to claim 10, wherein the outer case houses a cooling fan configured to take air into the housing through the air inlet.

15. The electronic apparatus according to claim 1, further comprising:
a cooling fan, provided between the air inlet and the filter housing, configured to take air into the housing through the air inlet.

16. The electronic apparatus according to claim 1, further comprising:
a guide plate provided opposite the air inlet with the filter housing interposed therebetween, to guide air to the air inlet.

17. The electronic apparatus according to claim 16, wherein the filter housing moves in the orthogonal direction to be positioned along the guide plate.

18. A filter unit comprising:
a first frame that includes a frame opening connecting to an air inlet of a housing; and
a second frame that includes a filter housing provided to house a first filter, that covers the air inlet, and a second filter, the second frame being configured to move in an orthogonal direction to a surface of the air inlet in such a manner that a state of the filter housing shifts from a closed state in which the first filter covers the air inlet to an open state in which the air inlet is uncovered,
wherein the second filter is housed between the first frame and the second frame in a folded state when the filter housing is in the closed state, and expands between the first frame and the second frame when the second frame moves in the orthogonal direction and the filter housing becomes the closed state.

19. A filter unit comprising:
an outer case that includes a case opening connecting to an air inlet of a housing, and a case housing port provided opposite the case opening; and
an inner case that includes a filter housing provided to house a first filter, that covers the air inlet, and a second filter, and a sidewall section extending from the filter housing to the case housing port, the inner case being housed in the outer case, wherein the inner case moves in an orthogonal direction to a surface of the air inlet and the inner case is drawn out from the outer case in such a manner that a state of the filter housing shifts from a closed state in which the first filter covers the air inlet to an open state in which the air inlet is uncovered,
wherein the second filter that is attached to the sidewall section expands between the outer case and the filter housing when the inner case moves in the orthogonal direction and the filter housing becomes the closed state.

* * * * *